(12) United States Patent  
Uemura et al.

(10) Patent No.: US 6,646,164 B2  
(45) Date of Patent: Nov. 11, 2003

(54) TRIPHENYLAMINE DERIVATIVE AND ORGANIC ELECTROLUMINESCENCE DEVICE COMPRISING THE SAME

(75) Inventors: Takashi Uemura, Osaka (JP); Nobuyuki Okuda, Osaka (JP); Yoshinobu Ueba, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 95 days.

(21) Appl. No.: 10/068,855

(22) Filed: Feb. 11, 2002

(65) Prior Publication Data

US 2002/0128514 A1 Sep. 12, 2002

Related U.S. Application Data

(62) Division of application No. 09/352,948, filed on Jul. 14, 1999, now abandoned.

(30) Foreign Application Priority Data

Jul. 16, 1998 (JP) .......................................... P. 10-202134  
May 19, 1999 (JP) .......................................... P. 11-139174

(51) Int. Cl.[7] ............................................. C07C 211/57
(52) U.S. Cl. .................. 564/429; 564/428; 564/426; 257/E51.018; 257/E51.051; 427/66; 428/690
(58) Field of Search ................................. 564/429, 428, 564/426; 57/E51.018, E51.051; 427/66; 428/690

(56) References Cited

U.S. PATENT DOCUMENTS

| 5,792,557 A | 8/1998 | Nakaya et al. |
| 5,792,567 A | 8/1998 | Kido et al. |

FOREIGN PATENT DOCUMENTS

| EP | 0 650 955 A1 | 5/1995 |
| EP | 0 704 436 A1 | 4/1996 |
| JP | 7-126226 | 5/1995 |
| JP | 10-25473 | 1/1998 |
| JP | 2851185 | 11/1998 |

OTHER PUBLICATIONS

"Organic electroluminescent diodes", C. W. Tang et al., Appl. Phys. Lett. 51 (12), Sep. 21, 1987, pp. 913–915.
"Organic electroluminescent device having a hole conductor as an emitting layer", C. Adachi et al., Appl. Phys. Lett. 55 (15), Oct. 9, 1989, pp. 1489–1491.
"Multilayer White Light–Emitting Organic Electroluminescent Device", J. Kido et al., Science, vol. 267, Mar. 3, 1995, pp. 1332–1334.
"Molecular design of hole transport materials for obtaining high durability in organic electroluminescent diodes", C. Adachi et al., Appl. Phys. Lett., 66 (20), May 15, 1995, pp. 2679–2681.
"High–temperature operation of an electroluminescent device fabricated using a novel triphenylamine derivative", S. Tokito et al., Appl. Phys. Lett., 69 (7), Aug. 12, 1996, pp. 878–880.
"Thermal Stability of Organic Electroluminescent Devices Fabricated Using Novel Charge Transporting Materials", S. Tokito et al., Macromol. Symp., 125, (1997), pp. 181–188.
"Organic electroluminescent devices using meta–linked triphenylamine oligomers", K. Noda et al., Preprint of 45th Joint Forum of Society of Applied Physics, Tokyo Engineering University, Mar. 1998.
"Text of 6th lecture held by Organic Molecule/Bioelectronics Course of Society of Applied Physics", (issued on Dec. 11, 1997), pp. 72–73.

*Primary Examiner*—Samuel Barts  
(74) *Attorney, Agent, or Firm*—McDermott, Will & Emery

(57) ABSTRACT

A triphenylamine derivative represented by the following general formula (1):

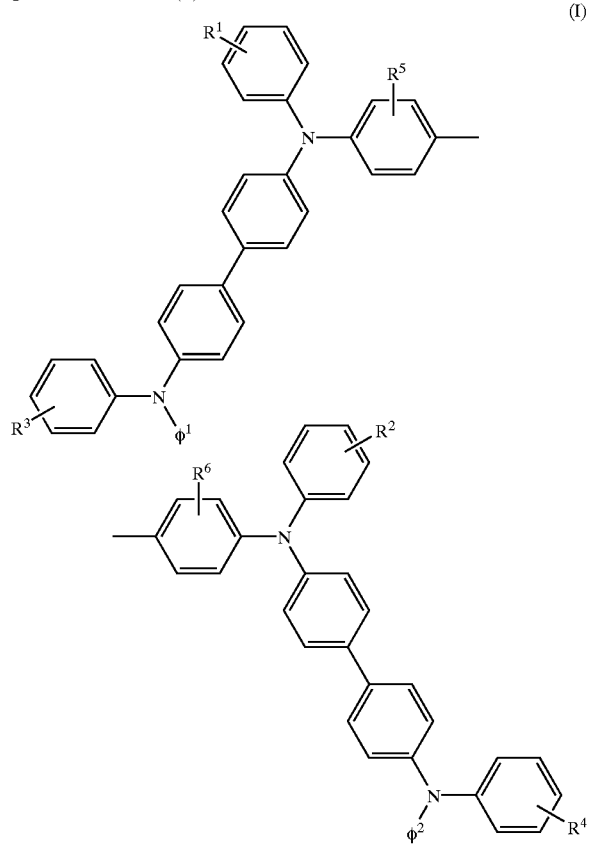

wherein $R^1$, $R^2$, $R^3$, $R^4$, $R^5$ and $R^6$ may be the same or different and each represents a hydrogen atom, alkyl group, halogenated alkyl group, aryl group, dialkylamino group or cyano group; and $\phi^1$ and $\phi^2$ may be the same or different and each represents an aromatic condensed ring which may have a substituent. Also disclosed is an electroluminescence device comprising the triphenylamine derivative.

17 Claims, 8 Drawing Sheets

TRIPHENYLAMINE DERIVATIVE AND ORGANIC ELECTROLUMINESCENCE DEVICE COMPRISING THE SAME

This application is a divisional of Ser. No. 09/352,948, filed Jul. 14, 1999, now abandoned.

FIELD OF THE INVENTION

The present invention relates to a novel triphenylamine derivative which can be preferably used as a hole-transporting material, e.g., for organic electroluminescence device and an organic electroluminescence device comprising the same.

BACKGROUND OF THE INVENTION

As an organic electroluminescence device comprising an organic layer mainly comprising an organic compound provided interposed between a pair of electrodes, i.e., cathode and anode there had been generally used one comprising a single organic layer. In recent years, however, various organic electroluminescence devices comprising a plurality of organic layers each independently having a function such as emission of light and transportation of carrier (e.g., hole, electron) (as disclosed in C. W. Tang and S. A. VanSlyke, "Appl. Phys. Lett.", 51, 913 (1987), C. Adachi, T. Tsutsui and S. Saito, "Appl. Phys. Lett.", 55, 1489 (1989), J. Kido, M. Kimura, and K. Nagai, "Science", Vol. 267, 1332 (1995)).

Such an organic electroluminescence device has the following advantages:

(1) It can emit light with a high luminance at a low voltage as compared with the conventional devices mainly comprising inorganic material;

(2) Since the formation of the various layers can be accomplished not only by vacuum evaporation method but also by solution coating method and any method can be selected taking into account the structure of each of the various layers, the degree of freedom of device design is enhanced, making it possible to enlarge the surface of device; and (3) A multi-color system can be provided by designing the organic molecules.

Examples of the various layers constituting the organic layer comprising a plurality of layers include light-emitting layer, hole-transporting layer capable of transporting hole, and electron-transporting layer capable of electron. These layers are each formed by the foregoing organic compounds having excellent various properties or by dispersing those organic compounds in an appropriate polymer binder.

However, the conventional organic electroluminescence devices are disadvantageous in that they exhibit insufficient stability and durability mainly attributed to (1) deterioration of organic compound itself due to Joule's heat developed when the device is energized or (2) deterioration in the carrier injection efficiency between various layers due to the reduction in smoothness of interface caused by the crystallization of organic compound by Joule's heat thus developed, and hence exhibit a drastically reduced luminance during a repeated use.

The foregoing problem is remarkable particularly with a hole-transporting material having a low heat resistance constituting a hole-transporting layer among the organic compounds constituting the foregoing various layers. It is not too much to say that the heat resistance of organic electroluminescence devices is determined by the heat resistance of such a hole-transporting material.

Under these circumstances, extensive studies have recently been made on the molecular structure of such a hole-transporting material to improve the heat resistance thereof.

For example, Adachi et al. attempted to improve the heat resistance by polymerizing a triphenylamine derivative known as a hole-transporting material such as N,N'-diphenyl-N,N'-bis(3-methylphenyl)-1,1'-biphenyl-4,4'-diamine (hereinafter abbreviated as "TPD", which represents a dimer of triphenylamine) represented by the following formula (3-1).

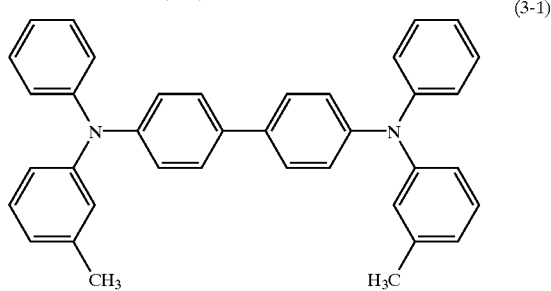

As a result, it was reported that a triphenylamine trimer (hereinafter referred to as "HTM1") represented by the following formula (4):

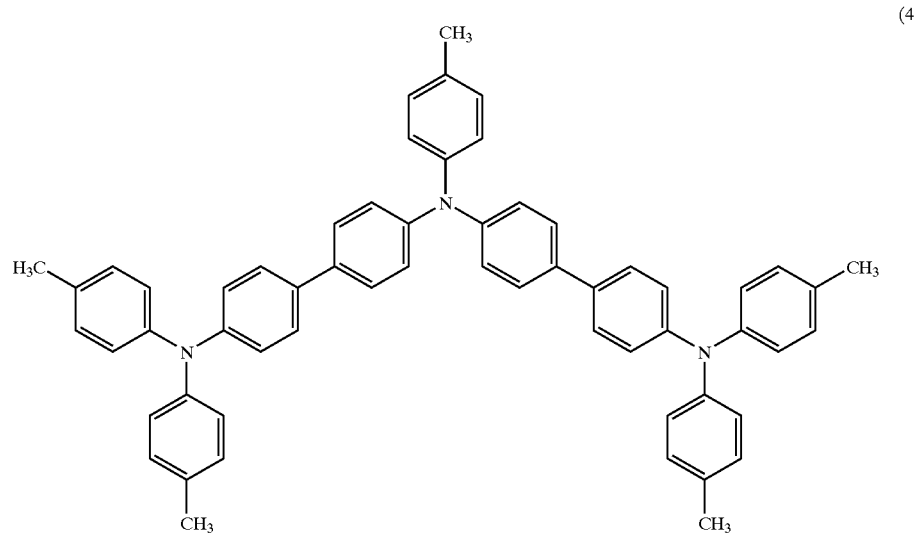

exhibits a high heat resistance and an excellent hole-transporting capacity (C. Adachi, K. Nagai and N. Tamoto, "Appl. Phys. Lett.", 66 (20), 2679 (1995)).

Further, Tokito et al. also attempted to improve the heat resistance by polymerizing a triphenylamine derivative in a similar manner as described above.

As a result, it was clarified that a triphenylamine tetramer (hereinafter referred to as "TPTE") represented by the following formula (5-1):

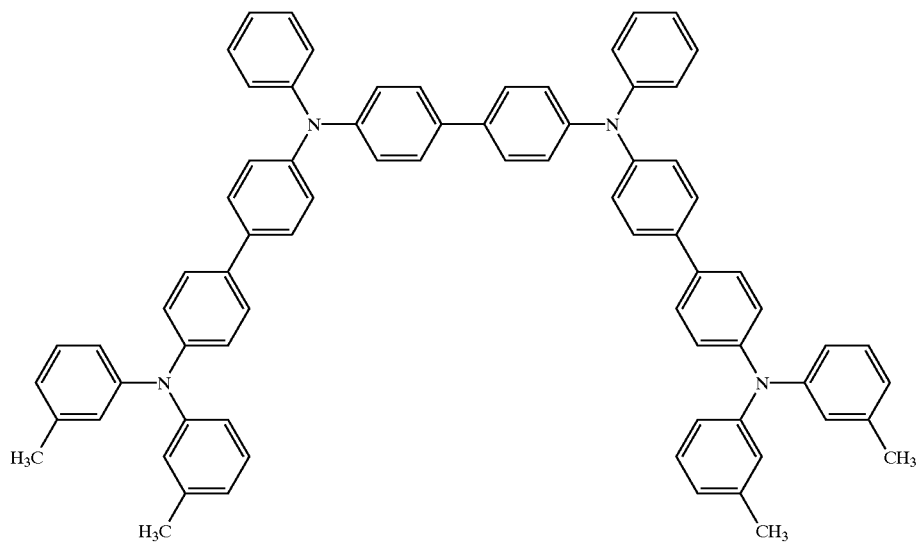

(5-1)

exhibits a high heat resistance and an excellent hole-transporting capacity (S. Tokito, H. Tanaka, A. Okada and Y. Taga, "Appl. Phys. Lett.", 69(7), 878 (1996); S. Tokito, H. Tanaka, K. Noda, A. Okada and Y. Taga, "Macromol. Symp.", 125, 181–188 (1997); JP-A-10-25473 (The term "JP-A" as used herein means an "unexamined published Japanese patent application")).

Further, JP-A-7-126226 discloses that a benzidine compound obtained by normalizing the biphenyl ring in the center of the foregoing TPTE into various divalent groups containing the biphenyl ring and normalizing the kind of substituents on various rings and the substitution positions therefor exhibits an excellent stability at the time of light emission and storage, as compared with low molecular weight hole-transporting materials such as the foregoing TPD.

The inventors made studies on the foregoing problems. It was found that the foregoing various polymerized compounds or their peripheral compounds certainly exhibit a stabilized heat resistance and stability as compared with the conventional TPD but leave something to be desired in their effects. In particular, these compounds cannot satisfy the high heat resistance required for on vehicle display devices.

In other words, on vehicle display devices must operate without any trouble even when continuously driven at a temperature as high as 85° C. and a humidity as high as 85% RH for 240 hours. Thus, the on vehicle display device, if it is in the form of organic electroluminescence device, must not show a drastic drop of luminance or stop light emission even when continuously operated under the foregoing high temperature and humidity conditions for 240 hours.

However, HTM1 (a trimer of triphenylamine) represented by the foregoing formula (4) exhibits a glass transition temperature Tg of about 110° C. and hence shows a difference as small as 25° C. from the foregoing ambient temperature, demonstrating that it exhibits an insufficient heat resistance. Thus, if continuously operated at such a high temperature and humidity, the foregoing generation of Joule's heat causes the temperature of the device itself to exceed the glass transition temperature Tg of HTM1 in an extremely short period of time, resulting in deterioration of the foregoing organic compound itself, i.e., HTM1 itself, or reduction in the injection efficiency between layers.

Further, the thickness of the organic layer constituting the device is as extremely small as about 0.1 μm in total, even if the organic layer comprises a plurality of layers. Thus, if there is some dispersion of thickness, current is concentrated into the section having the smallest thickness to cause local rise in temperature, resulting in the cracking and peeling of the organic layers that cause short-circuiting between the cathode and the anode.

It is thus expected that a device comprising HTM1 shows a drastic drop in luminance or stops light emission in a short period of time due to the foregoing defects.

The insufficient heat resistance of the organic electroluminescence device using HTM1 is also apparent from the fact described in the report by Tokito et al. that a device comprising TPTR, which is different from HTM1 only in the substitution position of terminal methyl group, has a critical temperature as described below of about 110° C.

This is also applicable to TPTE represented by the foregoing formula (5-1). In other words, TPTE exhibits a glass transition temperature Tg of 130° C. and hence shows a temperature difference as small as 45° C. from the foregoing ambient temperature of 85° C. Thus, if continuously operated at such a high temperature and humidity, it can be expected that the resulting deterioration of TPTE itself or the injection efficiency between layers or the short-circuiting between the cathode and the anode causes the device to show a drastic drop of luminance or to stop light emission in a short period of time.

The above described reference discloses that the upper limit of temperature at which an organic electroluminescence device comprising TPTE can operate is 140° C.

However, this temperature merely indicates the temperature (critical temperature) at which light emission stops when the ambient temperature is gradually raised while the device is being allowed to emit light. Thus, the temperature at which the device can stably and continuously emit light over an extended period of time was not confirmed therein.

According to the inventors' study, the organic electroluminescence device comprising TPTE is disadvantageous in that it exhibits too small an external quantum efficiency to emit light with a high luminance at a small current.

This phenomenon is considered to be attributed to the fact that TPTE forms, for example in a multi-layer structure device, an exciplex with an electron-transporting material such as tris(8-quinolilato) aluminum (III) complex (hereinafter referred to as "Alq") represented by the following formula (6):

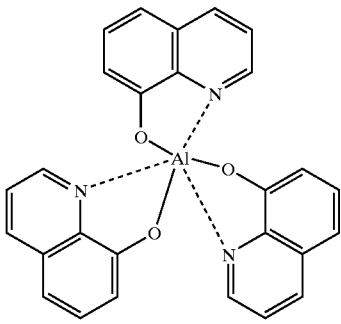

(6)

contained in the adjacent electron-transporting layer due to the interaction at the interface of the layers.

In an attempt to enhance the external quantum efficiency of devices by preventing the formation of such an exciplex, Noda et al. made a study on the molecular structure of TPTE. As a result, it was clarified that the foregoing object can be accomplished by employing a meta-position-linkage structure represented by the following formula (5-2):

(Koji Noda, Hisayoshi Fujikawa, Katsunori Koda, Hisato Takeuchi, Seiji Tokito, Yasukuni Taga, "Preprint of 45th Joint Forum of Society of Applied Physics", Tokyo Engineering University, March 1998).

However, the foregoing meta-position-linkage TPTE (hereinafter referred to as "m-TPTE") is disadvantageous in that it exhibits a glass transition temperature as low as about 90° C. and thus cannot be used for the purpose requiring a high heat resistance and reliability as in the foregoing on vehicle display device.

SUMMARY OF THE INVENTION

An object of the present invention is to provide a novel triphenylamine derivative which has further excellent heat resistance as compared to the conventional compounds and which is not accompanied with concern about easy formation of an exciplex with an electron-transporting material.

Another object of the present invention is to provide an organic electroluminescence device which comprises the triphenylamine derivative and thus has a high heat resistance and a high luminous efficiency at the same time.

Other objects and effects of the invention will become apparent from the following description.

To solve the foregoing problems, the inventors made extensive studies on the structure of triphenylamine derivative.

As a result, it was found that a compound obtained by replacing each one of the respective two phenyl groups connected to a nitrogen atom (N) at both terminals of the foregoing TPTE, i.e., two phenyl groups in total, by a naphthyl ring or higher aromatic condensed ring as shown in the following general formula (1):

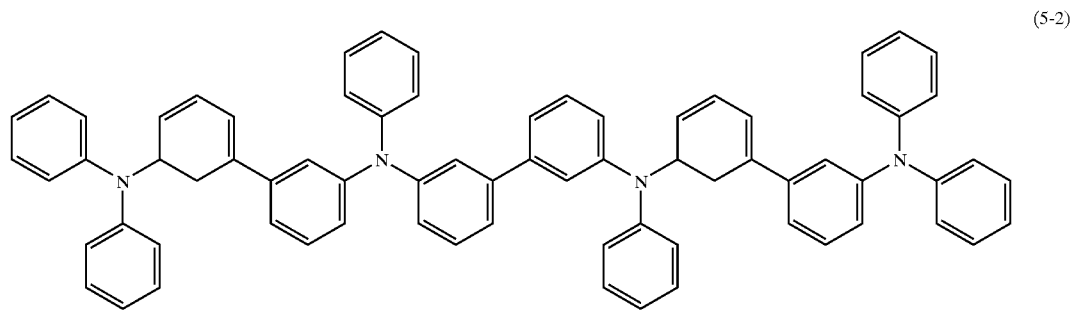

(5-2)

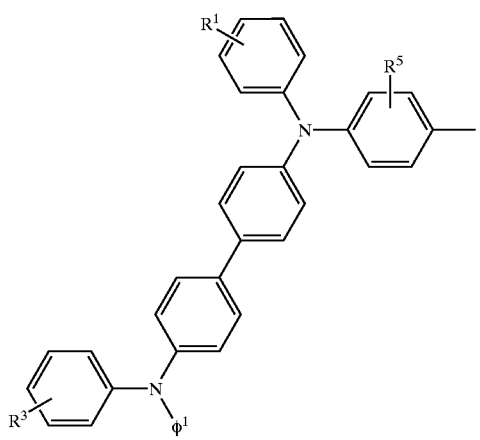

(I)

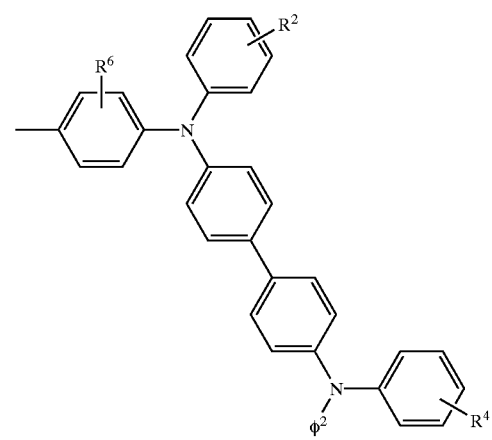

wherein $R^1$, $R^2$, $R^3$, R4, $R^5$ and $R^6$ may be the same or different and each represents a hydrogen atom, alkyl group, halogenated alkyl group, aryl group, dialkylamino group or cyano group; and $\phi^1$ and $\phi^2$ may be the same or different and each represents an aromatic condensed ring which may have a substituent, has the following advantages:

(1) The compound has a glass transition temperature Tg of not lower than about 140° C. and hence has a drastically improved heat resistance while maintaining the high hole-transporting capacity inherent to TPTE; and (2) The compound hardly forms an exciplex assumingly because of its stereostructure having substituted large aromatic condensed rings at its terminals or because of the distribution of π electron conjugated system.

The present invention has thus been worked out.

That is, the foregoing objects of the present invention have achieved by providing the following triphenylamine derivative and organic electroluminescence devices.

1) A triphenylamine derivative represented by the following general formula (1):

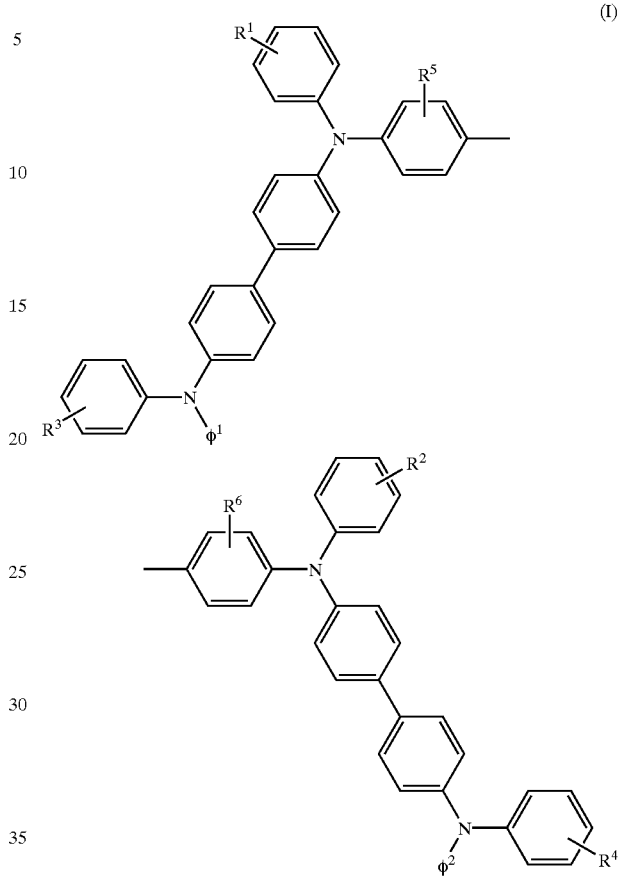

wherein $R^1$, $R^2$, $R^3$, R4, $R^5$ and $R^6$ may be the same or different and each represents a hydrogen atom, alkyl group, halogenated alkyl group, aryl group, dialkylamino group or cyano group; and $\phi^1$ and $\phi^2$ may be the same or different and each represents an aromatic condensed ring which may have a substituent.

2) An organic electroluminescence device comprising a cathode, an anode and an organic layer interposed between said electrodes, wherein said organic layer contains as a hole-transporting material a triphenylamine derivative represented by the following general formula (1):

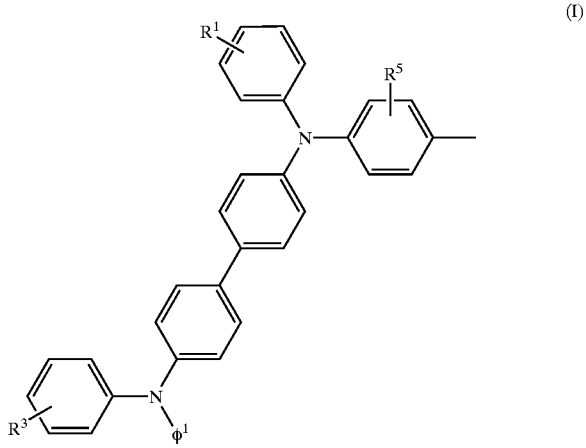

(I)

9

-continued

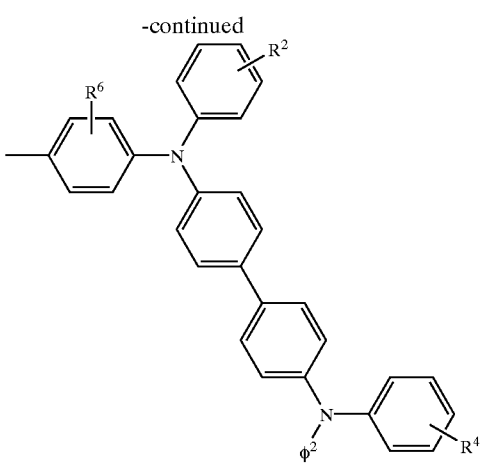

wherein R¹, R², R³, R4, R⁵ and R⁶ may be the same or different and each represents a hydrogen atom, alkyl group, halogenated alkyl group, aryl group, dialkylamino group or cyano group; and φ¹ and φ² may be the same or different and each represents an aromatic condensed ring which may have a substituent.

3) The organic electroluminescence device according to the above 2), wherein said organic layer comprises a single organic layer or a plurality of organic layers and at least one of said organic layers contains a triphenylamine derivative represented by general formula (1).

4) The organic electroluminescence device according to the above 3),
wherein said anode is an electrically-conductive transparent layer which comprises an electrically-conductive transparent material and which is formed on a substrate, and
wherein said layer containing the triphenylamine derivative is a hole-transporting layer provided on said electrically-conductive transparent layer directly or via a single hole-injecting layer.

5) The organic electroluminescence device according to the above 3), wherein said layer containing the triphenylamine derivative further contains at least one fluorescent dye.

10

6) The organic electroluminescence device according to the above 3), said organic layer comprises a layer containing as an electron-transporting material a 1,2,4-triazole derivative represented by the following general formula (2):

(2)

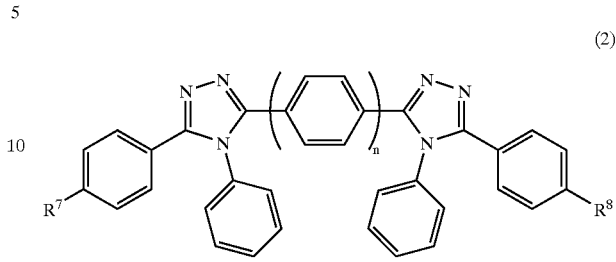

wherein R⁷ and R⁸ may be the same or different and each represents a cyano group or diarylamino group; and n represents an integer of 1 or 2.

7) The organic electroluminescence device according to the above 2), wherein said triphenylamine derivative is represented by the following formula (1-3):

(1–3)

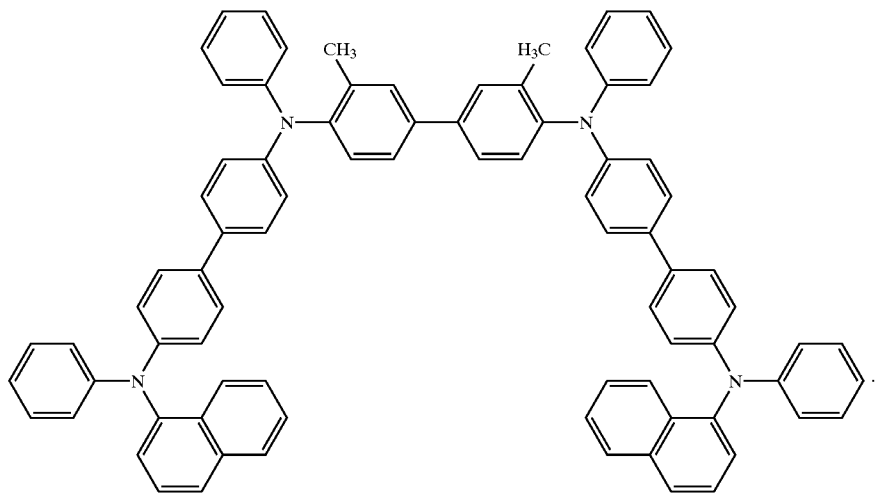

Japanese Patent 2,851,185 discloses a device comprising a positive hole-transporting aromatic tertiary amine containing at least two tertiary amine components and at least two condensed aromatic rings connected to the nitrogen atom in the tertiary amine.

However, a further review of specific examples of the positive hole-transporting aromatic tertiary amine described in the 32nd column of the above cited patent shows that the tertiary amine thus proposed is nothing but one obtained by replacing at least two of phenyl groups or the like in a low molecular weight hole-transporting material having a unpolymerized base structure such as the foregoing TPD by condensed aromatic rings.

Further, the effect of the tertiary amine thus proposed is nothing but to improve the stability of the device as compared with the low molecular weight hole-transporting material. The above cited patent does not disclose or suggest improving the heat resistance of devices at high temperatures conditions together with improving the luminous efficiency thereof as attained in the present invention.

On the other hand, the present invention has been worked out on the basis of a new knowledge that by polymerizing the triphenylamine derivative to increase the resulting glass transition temperature Tg, the device has an unprecedentedly enhanced heat resistance at high temperatures and the formation of an exciplex accompanying the polymerization can be avoided on account of the condensed aromatic rings introduced into the molecule, to thereby enhance the luminous efficiency of the device. Accordingly, the present invention is not a mere combination of the foregoing polymerization technique developed by Tokito et al. and the condensed aromatic ring described in the above cited patent.

DETAILED DESCRIPTION OF THE INVENTION

Figure 1:
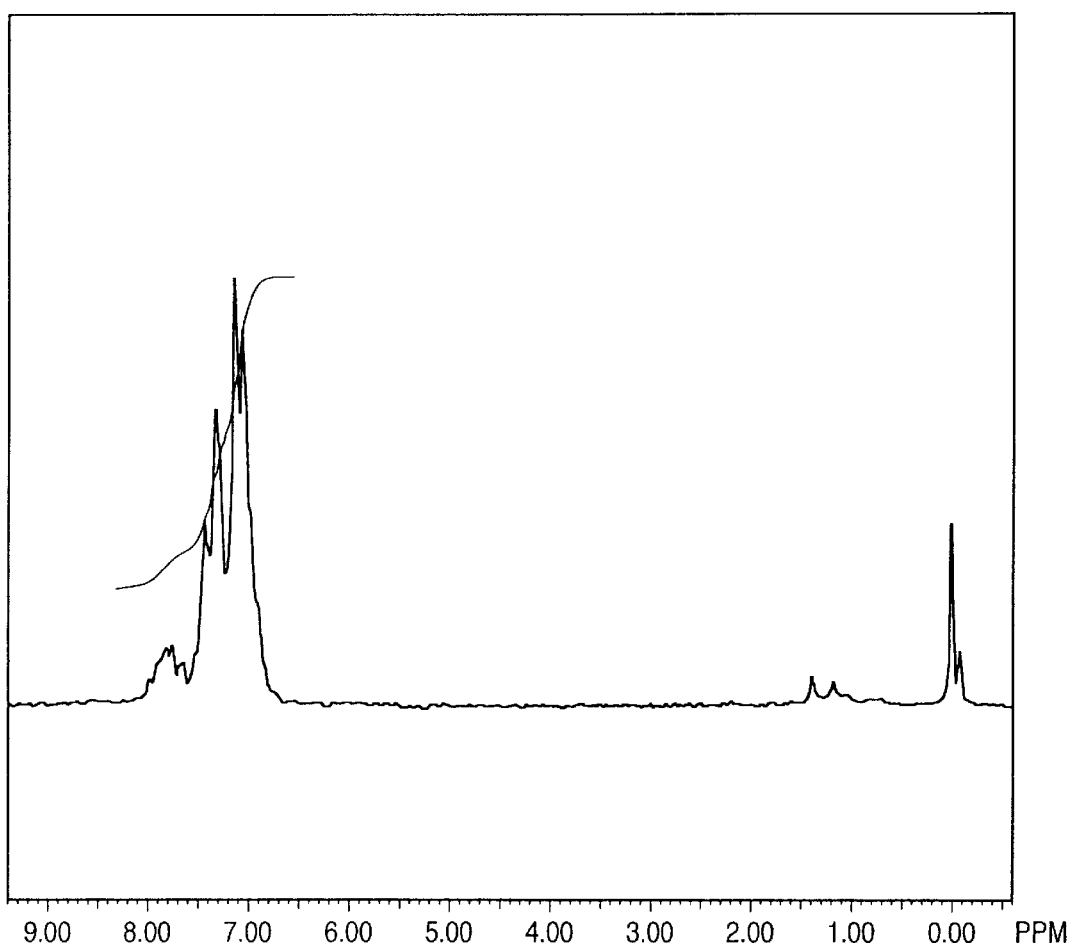
FIG. 1 is a graph illustrating $^1$H-NMR chart of NPTE-1 of the present invention synthesized in Synthesis Example 1.

The present invention is described in detail below.

First, the triphenylamine derivative according to the present invention is described in detail below.

As the alkyl group corresponding to $R^1$, $R^2$, $R^3$, R4, $R^5$ or $R^6$ in the foregoing general formula (1) representing the triphenylamine derivative of the present invention there may be preferably used a $C_{1-6}$ alkyl group such as methyl, ethyl, n-propyl, isopropyl, n-butyl, isobutyl, sec-butyl, tert-butyl, pentyl and hexyl.

As the halogenated alkyl group there may be used, e.g., a group obtained by replacing all or some of hydrogen atoms in the foregoing $C_{1-6}$ alkyl group by fluorine, chlorine, bromine or iodine. Specific examples of such a halogenated alkyl group include trifluoromethyl group (—$CF_3$), but the present invention should not be construed as being limited thereto.

Examples of the foregoing aryl group include phenyl, biphenyl, o-terphenyl, naphthyl, anthryl, and phenanthryl. These aryl groups may have substituents such as the foregoing alkyl group at arbitrary positions on the ring. Specific examples of the aryl group having substituents include tolyl, and xylyl, but the present invention should not be construed as being limited thereto.

As the dialkylamino group there may be used a group obtained by replacing both the two hydrogen atoms in the amino group by the foregoing alkyl group. Specific examples of such a dialkylamino group include diethylamino group, but the present invention should not be construed as being limited thereto.

Examples of the aromatic condensed ring corresponding to $\phi^1$ or $\phi^2$ in the foregoing general formula (1) include naphthyl, anthryl, and phenanthryl. Such an aromatic condensed ring may have substituents such as the foregoing alkyl group at arbitrary positions on the ring.

Specific examples of the triphenylamine derivative of the present invention represented by the general formula (1) (hereinafter referred to as "triphenylamine derivative (1)") include N,N'-diphenyl-N,N'-bis(N-phenyl-N-(2-naphthyl)-4'-aminobiphenyl-4-il)-1,1'-biphenyl-4,4'-diamine (glass transition temperature Tg: 148° C.; hereinafter referred to as "NPTE-1") represented by the following formula (1-1):

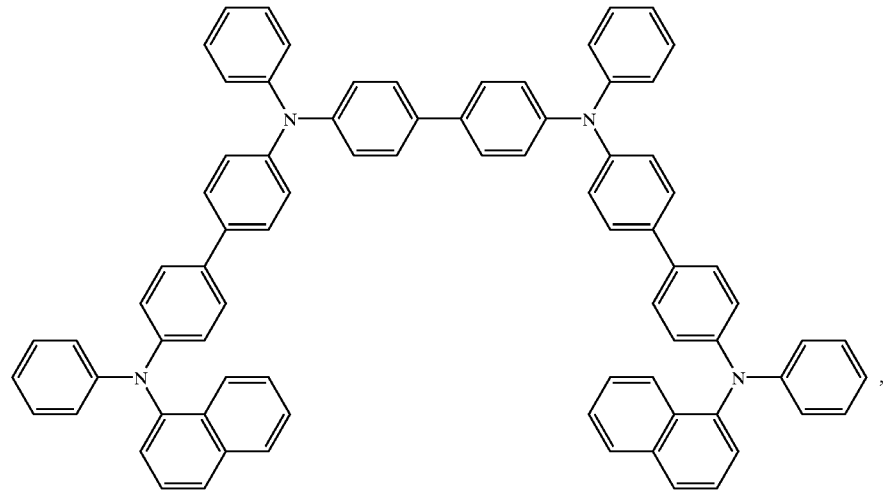

(1-1)

N,N'-bis(4-(tert-butyl)phenyl)-N,N'-bis(N-4-(tert-butyl)phenyl-N-(2-naphthyl)-4"-aminobiphenyl-4-il)-1,1'-biphenyl-4,4'-diamine (glass transition temperature Tg: 175° C., hereinafter referred to as "NPTE-2") represented by the following formula (1-2):

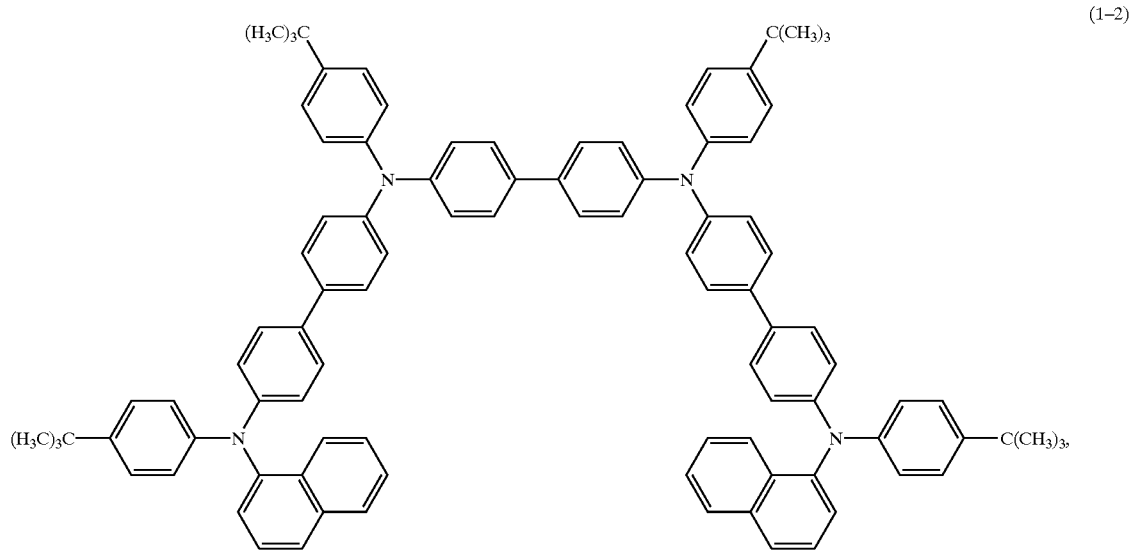

N,N'-diphenyl-N,N'-bis(N-phenyl-N-(2-naphthyl)-4'-aminobipheny-l-4-il)-1,1'-biphenyl-3,3'-dimethyl-4,4'-diamine (glass transition temperature Tg: 145° C., hereinafter referred to as "NPTE-3") represented by the following formula (1-3):

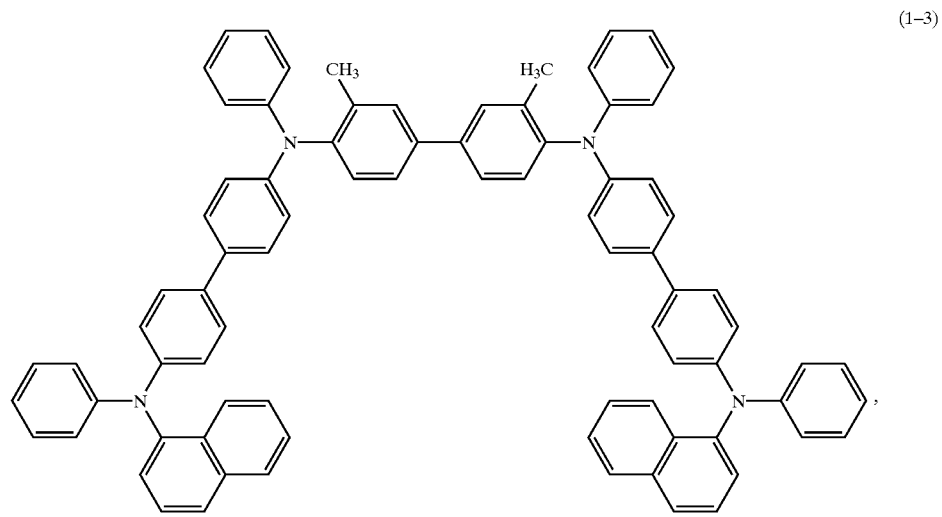

However, the present invention is not limited thereto.

The synthesis of the triphenylamine derivative of the present invention can be accomplished, e.g., by the following method. In the following description, synthesis method is described with reference to the synthesis of NPTE-1 represented by the foregoing formula (1-1) among the triphenylamine derivatives of the present invention. In practice, however, other triphenylamine derivatives (1) can be synthesized similarly in principle.

N-phenyl-N-(2-naphthyl)amine represented by formula (1a) below and 4,4'-diodobiphenyl represented by formula (1b) below as starting materials are reacted at a molar ratio of 1:1 to synthesize 4-(N-phenyl-N-(2-naphthyl))amino-4'-iodobiphenyl represented by the following formula (1c).

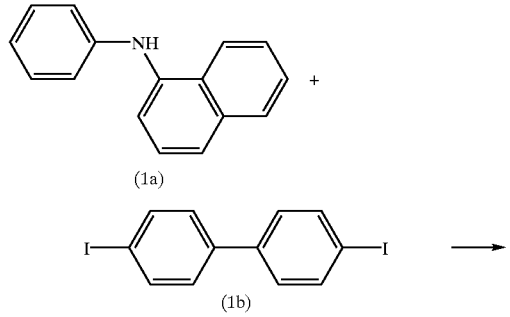

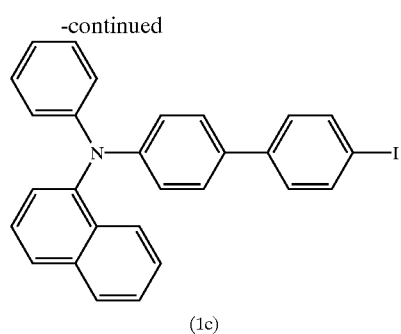

Thereafter, 4-(4-phenyl-N-(2-naphthyl))amino-4'-iodo biphenyl represented by the foregoing formula (1c) is reacted with N,N'-diphenylbezidine represented by formula (1d) below at such a molar ratio that the former is more excess than the case of a molar ratio of 2:1 to synthesize NPTE-1 represented by the following formula (1-1).

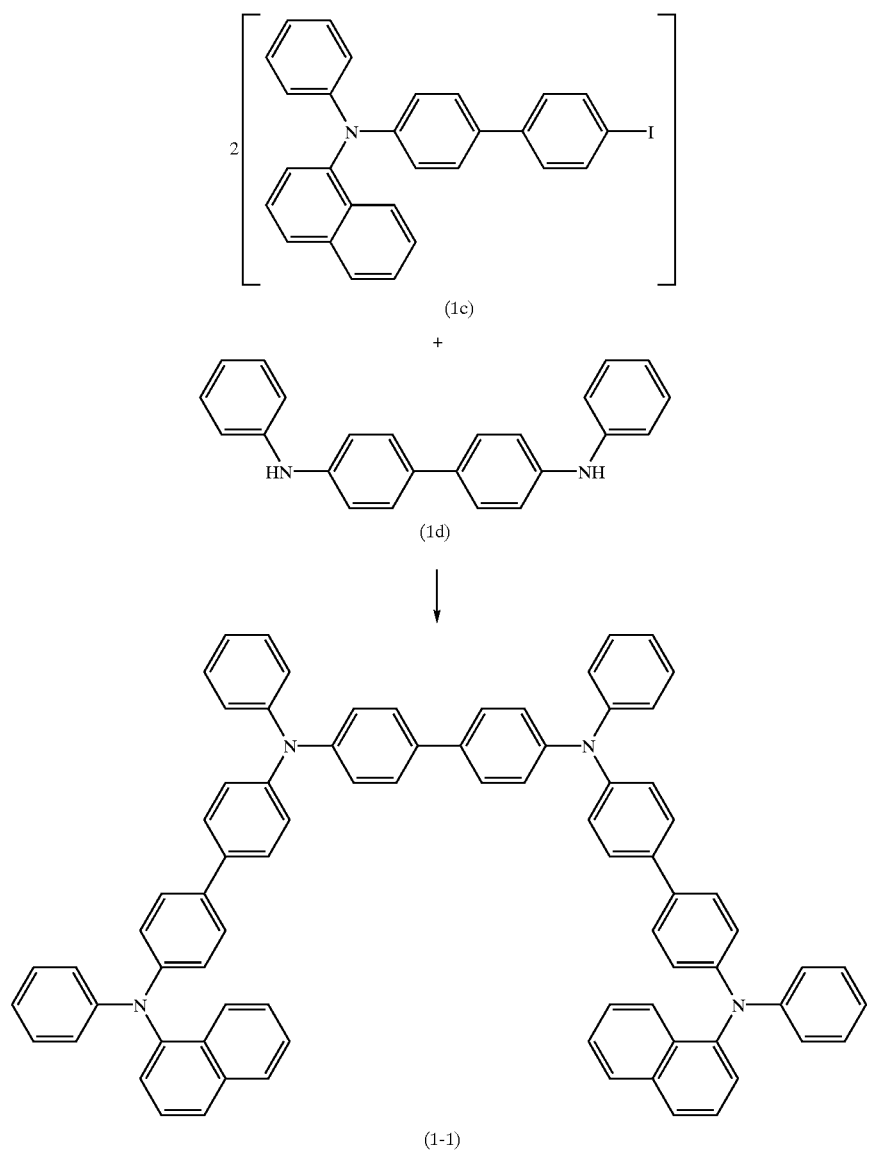

The triphenylamine derivative of the present invention as described above can be used as a photoreceptor for an apparatus utilizing an electrophotographic process such as copying machines or a hole-transporting material in various fields such as solar batteries. In particular, the triphenylamine derivative of the present invention is preferably used as a hole-transporting material for organic electroluminescence device as described above.

In particular, NPTE-3 represented by the foregoing formula (1-3) can exert an excellent effect of enhancing the luminous efficiency of organic electroluminescence device in addition to the high heat resistance inherent to the triphenylamine derivative (1) of the present invention as made obvious from the results of examples described below. Thus, NPTE-3 can be preferably used as a hole-transporting material in particular.

The organic electroluminescence device of the present invention is described in detail below.

The organic electroluminescence device of the present invention is not limited in its structure so far as at least one of organic layers provided interposed between the cathode and the anode contains the foregoing triphenylamine derivative (1) of the present invention as a hole-transporting material.

The organic layer may have either a single-layer or multi-layer structure. Among these layer structures, the organic layer having a single-layer structure may be formed by the foregoing triphenylamine derivative (1) of the present invention as a hole-transporting material alone because the triphenylamine derivative has a high heat resistance. Alternatively, the single-layer structure organic layer may be formed by optionally adding other hole-transporting materials or electron-transporting materials, fluorescent dyes, etc. described below, in addition to triphenylamine derivative (1) as needed. Further alternatively, the foregoing various materials may be dispersed in a polymer having or free of carrier-transporting capacity itself as a binder to form a single-layer organic layer.

The thickness of the single organic layer is about the same as conventional, i.e., preferably from 50 to 1,000 nm, particularly from 100 to 200 nm.

On the other hand, the number of layers and layer constitution of the multi-layer organic layer are not specifically limited. For example, the multi-layer organic layer can be formed by properly selecting and combining two or more of the following various layers sequentially from the anode side to the cathode side. At least one of these layers comprises triphenylamine derivative (1) of the present invention incorporated therein as a hole-transporting material.

(a) A layer which helps the injection of holes from the anode to the cathode (hole-injecting layer);

(b) A layer which transports holes injected from the anode to the cathode (hole-transporting layer);

(c) A layer which transports electrons injected from the cathode to the anode (electron-transporting layer); and (d) A layer which helps the injection of electron from the cathode to the anode (electron-injecting layer)

These various layers may be each formed by only an organic compound having a specific function. Alternatively, these various layers may be each formed by dispersing the foregoing organic compound in a polymer having or free of carrier-transporting capacity itself as a binder.

Specific examples of the multi-layer organic layer comprising the foregoing various layers include (A) a layer structure comprising two layers, i.e., a hole-transporting layer and an electron-transporting layer, either or both of which is capable of emitting light, (B) a layer structure comprising three layers, i.e., a hole-injecting layer, a hole-transporting layer and an electron-transporting layer, of which the hole-transporting layer and/or the electron-transporting layer is capable of emitting light, (C) a layer structure comprising three layers, i.e., a hole-transporting layer, an electron-transporting layer and an electron-injecting layer, of which the hole-transporting layer and/or the electron-transporting layer is capable of emitting light, and (D) a layer structure comprising four layers, i.e., a hole-injecting layer, a hole-transporting layer, an electron-transporting layer and an electron-injecting layer, of which the hole-transporting layer and/or the electron-transporting layer is capable of emitting light, but the present invention should not be construed as being limited thereto.

Which or both of the hole-transporting layer and the electron-transporting layer emits light in the device having the foregoing layer structure can be properly predetermined by adjusting the degree and combination of the functions of organic compounds contained in the two layers (e.g., hole-transporting capacity if it is a hole-transporting material or electron-transporting capacity if it is an electron-transporting layer), the thickness of the various layers, etc.

Among the foregoing various layers, the layer capable of emitting light may comprise one or more fluorescent dyes incorporated therein to adjust the wavelength of light emitted therefrom.

The triphenylamine derivative (1) of the present invention may be incorporated in any of the foregoing various layers but preferably in the hole-injecting layer or hole-transporting layer.

Examples of organic compound having excellent hole-injecting properties constituting the hole-injecting layer among the foregoing various layers include a copper phthalocyanine represented by the following formula (7):

(7)

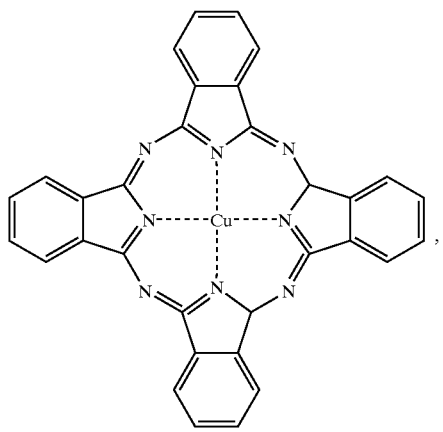

polyaniline, polythiophene, and carbon. The hole-injecting layer may comprise a triphenylamine derivative (1) of the present invention incorporated therein as mentioned above in addition to the foregoing hole-injecting materials. Alternatively, the hole-injecting layer may comprise hole-transporting materials other than triphenylamine derivative (1) incorporated therein.

As the hole-transporting material constituting the hole-transporting layer there may be mainly used the triphenylamine derivative (1) of the present invention. Besides the triphenylamine derivative (1) of the present invention, other known conventional hole-transporting materials such as the foregoing TPD, TPTE, HTM1 and m-TPTE and N,N'-diphenyl-N,N'-di(2-naphthyl)-1,1'-biphenyl-4,4'-diamine (hereinafter referred to as "NPD") represented by the following formula (3-2):

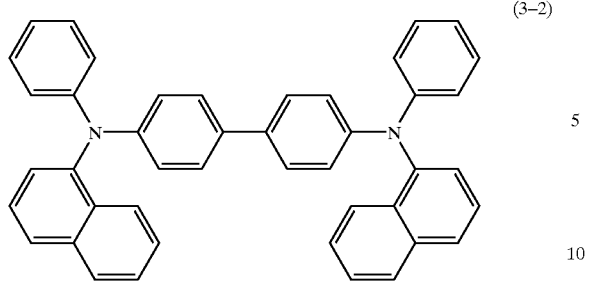

(3-2)

may also be used in combination so far as the heat resistance of the device is not impaired.

Examples of the electron-transporting material constituting the electron-transporting layer include, besides the above-described Alq, a 1,2,4-triazole derivative (hereinafter referred to as "DPTAZ2") represented by the following formula (2-1):

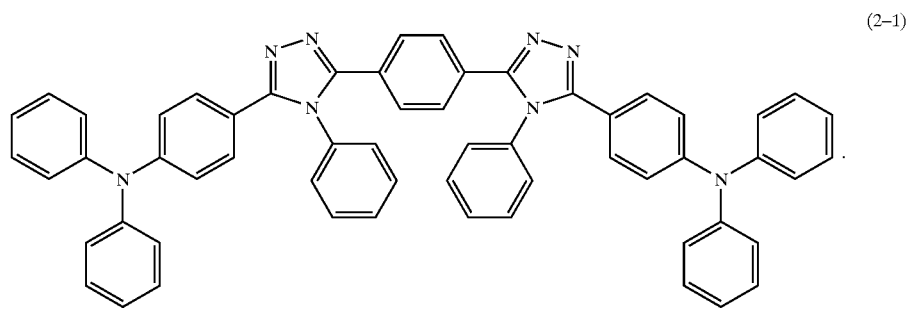

(2-1)

The electron-injecting layer comprises a material having excellent electron-injecting properties among electron-transporting materials. Examples of such an electron-injecting material having excellent electron-injecting properties include the foregoing Alq, and a 1,2,4-triazole derivative such as cyano group-substituted triazole dimer (hereinafter referred to as "CNTAZ2") represented by the following formula (2-2).

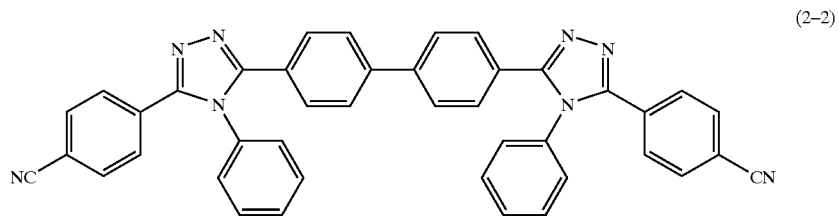

(2-2)

As the fluorescent dyes which may be incorporated in the layer capable of emitting light among the hole-transporting layer and/or electron-transporting layer there may be used various dyes which can be excited by exciton such as a dye for laser singly or in combination depending on the desired wavelength of light emitted.

Specific examples of the fluorescent dye include cyanine dye, xanthene dye, oxazine dye, coumarine dye, quinacridone derivative, naphthacene derivative, perylene derivative, acridine dye, acridone dye, and quinoline dye.

Specific examples of these fluorescent dye employable herein include coumarine 6 (emitting green light) represented by the following formula (8):

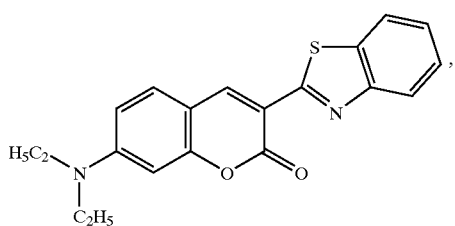

(8)

coumarine 7 represented by the following formula (9):

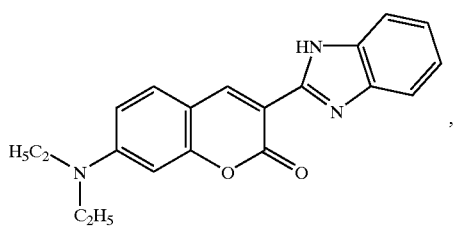

(9)

quinacridone dyes (emitting green light) represented by the following formulae (10-1) and (10-2):

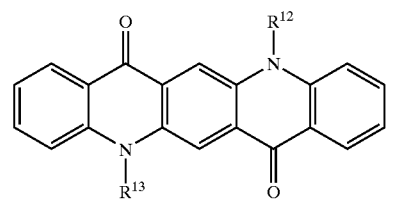

(10-1)

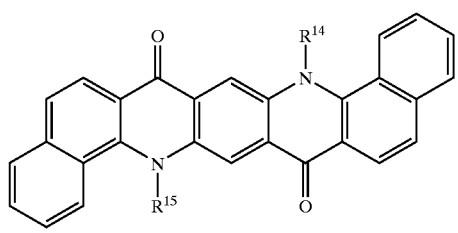

(10-2)

wherein $R^{12}$, $R^{13}$, $R^{14}$ and $R^{15}$ may be the same or different and each represents a hydrogen atom, alkyl group or aryl group, and rubrene (5,6,11,12-tetraphenylnaphthacene, emitting yellow light) represented by the following formula (11):

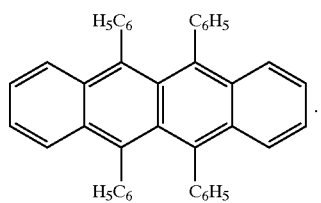

(11)

Besides these fluorescent dyes, tetraphenyl butadiene, dicyanomethylenestyryl pyrane-based dyes such as 4-dicyanomethylene-2-methyl-6-p-dimethylaminostyryl-4H-pyrane, perylene, Nile red, etc. may be used as fluorescent dyes.

The thickness of the foregoing various layers constituting the multi-layer organic layer is not specifically limited. In practice, however, these layers each preferably have a thickness of from 5 to 100 nm, particularly from 10 to 80 nm.

The total thickness of the multi-layer organic layer obtained by laminating two or more of the foregoing layers is preferably from 80 to 200 nm, particularly from 100 to 150 nm, though depending on the number of layers laminated, etc.

The single-layer or multi-layer organic layer can be formed by various methods as previously mentioned. In some detail, a gas phase growth method such as so-called vacuum evaporation method may be used which comprises resistance-heating and subliming an organic compound constituting the organic layer in vacuo so that it is deposited on the substrate. Alternatively, a solution coating method may be used which comprises applying a solution of an organic compound constituting the organic layer in a proper solvent to the substrate by spin coating method, dip coating method or the like, and then drying the coated material so that the solvent is removed away.

At least one of the cathode and anode, between which the organic layer is provided interposed, needs to be transparent to take light emitted by the light-emitting layer out of the device.

Taking into account the work function related to the injection efficiency of electrons and holes and other factors, it is usual that the anode is formed by an electrically-conductive transparent material such as ITO (indium tin oxide) and IXO ($In_2O_3(ZnO)_m$ hexagonally layered compound) and thus is formed transparent while the cathode is formed by an alloy of alkali metal or alkaline earth metal such as Mg/Ag and Al/Li or a laminate of a layer comprising a lithium compound such as lithium oxide with a layer comprising a metal such as Al. It is also usual that the anode is provided directly on the substrate while the cathode is provided on the uppermost organic layer laminated on the anode such that light can be taken out of the device through the anode and the substrate. In the present invention, such a structure is preferably employed.

Further, if the cathode has a two-layer structure consisting of a layer comprising, e.g., the foregoing alloy having a thickness of not more than 100 nm, preferably not more than 50 nm (electron-injecting electrode), and a layer comprising an electrically-conductive transparent material laminated thereon, the cathode per se is also transparent. In this arrangement, the use of a transparent material as protective layer for protecting these various layers, sealing material for sealing these layers, etc. makes it possible to obtain an organic electroluminescence device which generally stays transparent when it emits no light.

As the substrate for supporting the foregoing various layers there may be used any suitable material such as glass plate, plastic plate, plastic film, metal plate and metal foil.

In the case of the foregoing device configured such that the anode among the two electrodes is transparent to allow light emitted to be taken out through the substrate or the foregoing device configured such that both the two electrodes are transparent, that is, the device is wholly transparent, a glass plate or plate or film comprising a highly transparent plastic is preferably used among the foregoing substrate materials.

In the case of the device configured such that the cathode and sealing material are transparent to allow light emitted to be taken out through the cathode, the substrate may be either transparent or opaque. As the substrate there may be used any of the foregoing substrate materials.

Further, the use of a flexible plastic film or metal foil as a substrate material makes it possible to obtain a flexible device.

Moreover, the substrate, if formed by a plate or film comprising a photosensitive plastic, can be exposed to light to an extent such that the device is not deteriorated to form a pattern thereon, making it possible to prepare a device having a predetermined planar shape.

The device of the present invention may be partially or wholly sealed with a sealing material after the formation of the various layers to prevent itself from coming in contact with the atmosphere during light emission and hence prevent the organic compound constituting the organic layer from being subject to oxidative deterioration that drastically deteriorates the luminance or stops light emission.

As such sealing materials there may be used various resins such as epoxy resin, polyester resin and silicone resin. The sealing of the device with such a sealing material can be accomplished by any known method such as potting and dipping.

The organic electroluminescence device of the present invention comprising the foregoing various components can be used as a back light for liquid crystal display device or a planar light-emitting material for illuminator. Further, the organic electroluminescence device of the present invention can form a light-emitting layer or cathode and anode thereon in a predetermined pattern such that it can be used as a segment display device, dot matrix display device, etc.

The present invention will be described in greater detail with reference to the following Synthesis Examples, Examples and comparative Examples, but the invention should not be construed as being limited thereto.

EXAMPLES

Synthesis of Triphenylamine Derivative

Synthesis Example 1

A suspension obtained by adding to 50 ml of decalin 15.0 g (68.4 mmol) of N-phenyl-N-(2-naphthyl)amine, 27.8 g (68.40 mmol) of 4,4'-diodobiphenyl represented by the formula (1b), 18.9 g (136.81 mmol) of potassium carbonate and 0.9 g (13.68 mmol) of copper powder was heated to a 200° C. with stirring in a stream of argon to undergo reaction for 4 days.

To the reaction solution were then added 4.7 g (34.20 mmol) of potassium carbonate and 0.9 g (13.68 mmol) of copper powder. The reaction solution was then allowed to undergo reaction under the same conditions for 4 days.

The reaction solution was then filtered while being kept at the high temperature to remove insoluble matters therefrom. The filtrate was then washed with toluene.

The filtrate was allowed to cool, again filtered to remove 4,4'-diodobiphenyl therefrom, washed with ethyl acetate, and then subjected to distillation under reduced pressure to remove the solvent therefrom.

The residue was then twice subjected to separation and purification through silica gel column chromatography (packed amount of silica gel: 2,000 g; elution: toluene/n-hexane=1/3) to collect an effective fraction. To the effective fraction was then added n-hexane to cause reprecipitation resulting in crystallization. The solvent was then removed by filtration. The residue was then dried to obtain 4-(N-phenyl-N-(2-naphthyl))amino-4'-iodophenyl. The yield was 6.1 g (18.1%).

Subsequently, a suspension obtained by adding to 30 ml of nitrobenzene 6.0 g (12.06 mmol) of 4-(N-phenyl-N-(2-naphthyl))amino-4'-iodobiphenyl, 1.4 g (4.02 mmol) of N,N'-diphenylbenzidine, 2,2 g (16.08 mmol) of potassium carbonate and 0.1 g (1.61 mmol) of copper powder was heated to a temperature of 220° C. with stirring in a stream of argon to undergo reaction for 6 days.

The reaction solution was then filtered while being kept at the high temperature to remove insoluble matters therefrom. The filtrate was then washed with tetrahydrofuran.

The filtrate was allowed to cool, and then added to methanol to cause crystallization. The solvent was then removed by filtration to obtain a crude crystal.

The crude crystal thus obtained was then subjected to separation and purification through silica gel column chromatography (packed amount of silica gel: 2,000 g; packing: toluene/n-hexane=1/2; elution: toluene/n-hexane=1/2–1/1) to collect an effective fraction. Subsequently, the material was then subjected to separation and purification through silica gel column chromatography (packed amount of silica gel: 4,000 g; packing: toluene/n-hexane=1/2; elution: toluene/n-hexane=1/2–1/1) to collect an effective fraction.

The crystal thus obtained was dissolved in tetrahydrofuran, and then added to ethanol to cause reprecipitation resulting in crystallization. The solvent was then removed by filtration. The crystal thus obtained was then subjected to separation and purification through silica gel column chromatography (packed amount of silica gel: 1,000 g; packing: toluene/n-hexane=2/3; elution:toluene/n-hexane=2/3–1/1) to collect an effective fraction.

The product thus purified was then melted at a temperature of 300° C. for 5 minutes at a pressure of 0.03 torr in a sublimating apparatus. The resulting bottom was collected to obtain the desired compound in crystal form. The yield was 2.1 g (46.9%).

The crystal thus obtained was subjected to elementary analysis by CHN mass spectroscopy. The results show that there is substantially the complete agreement between the measured values and theoretical values as shown below.

TABLE 1

| Element | C | H | N |
| --- | --- | --- | --- |
| Theoretical (wt %) | 89.4 | 5.4 | 5.2 |
| Measured (wt %) | 89.7 | 5.3 | 5.0 |

Figure 2:
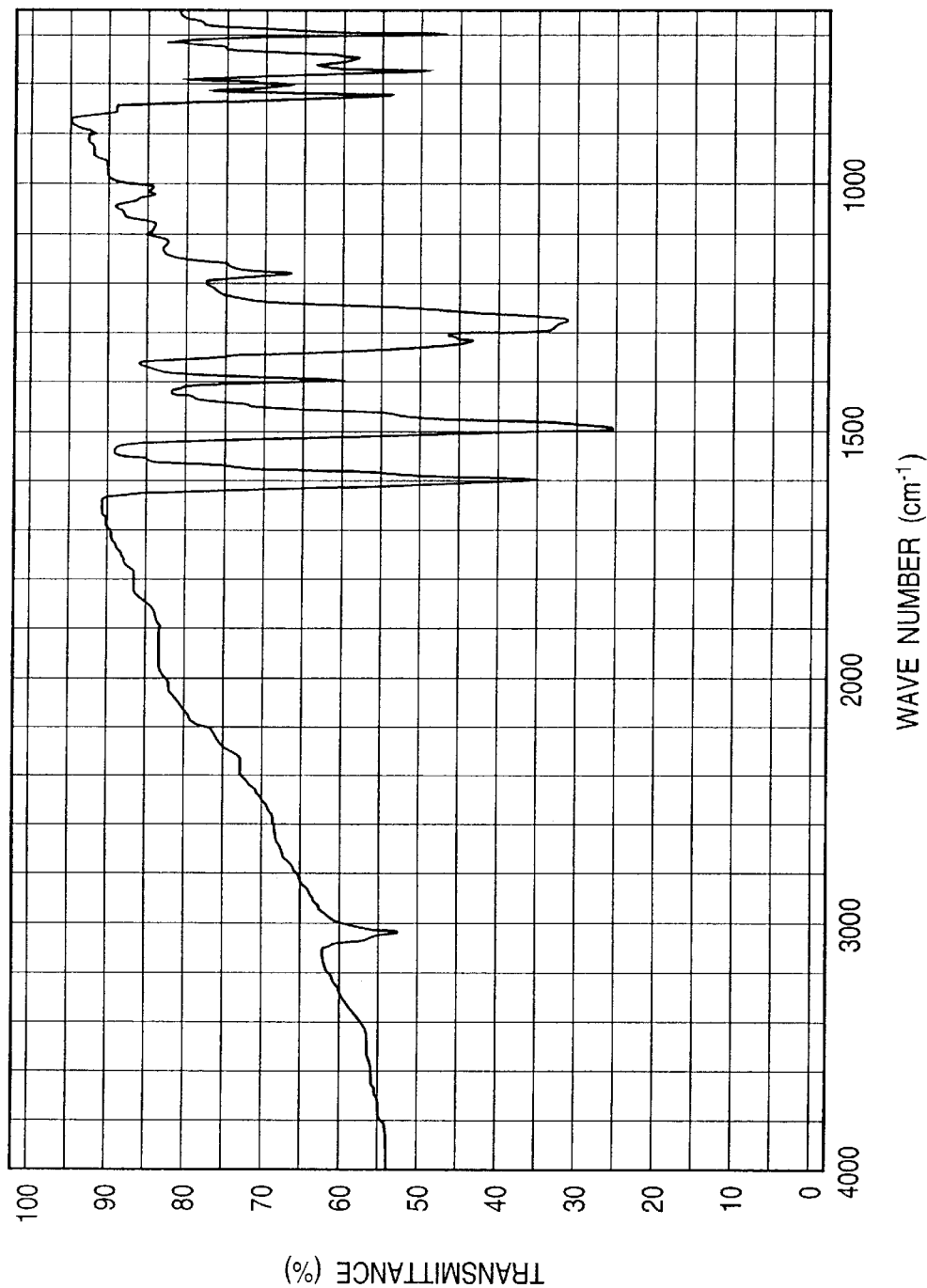
FIG. 2 is a graph illustrating IR chart of NPTE-1.

Further, it was confirmed from the chart of FIG. 1 illustrating the results of $^1$H-NMR measurement and the chart of FIG. 2 illustrating the results of infrared absorption spectrum measurement that the crystal thus obtained is the desired compound, which is NPTE-1 represented by the foregoing formula (1-1).

Figure 3:
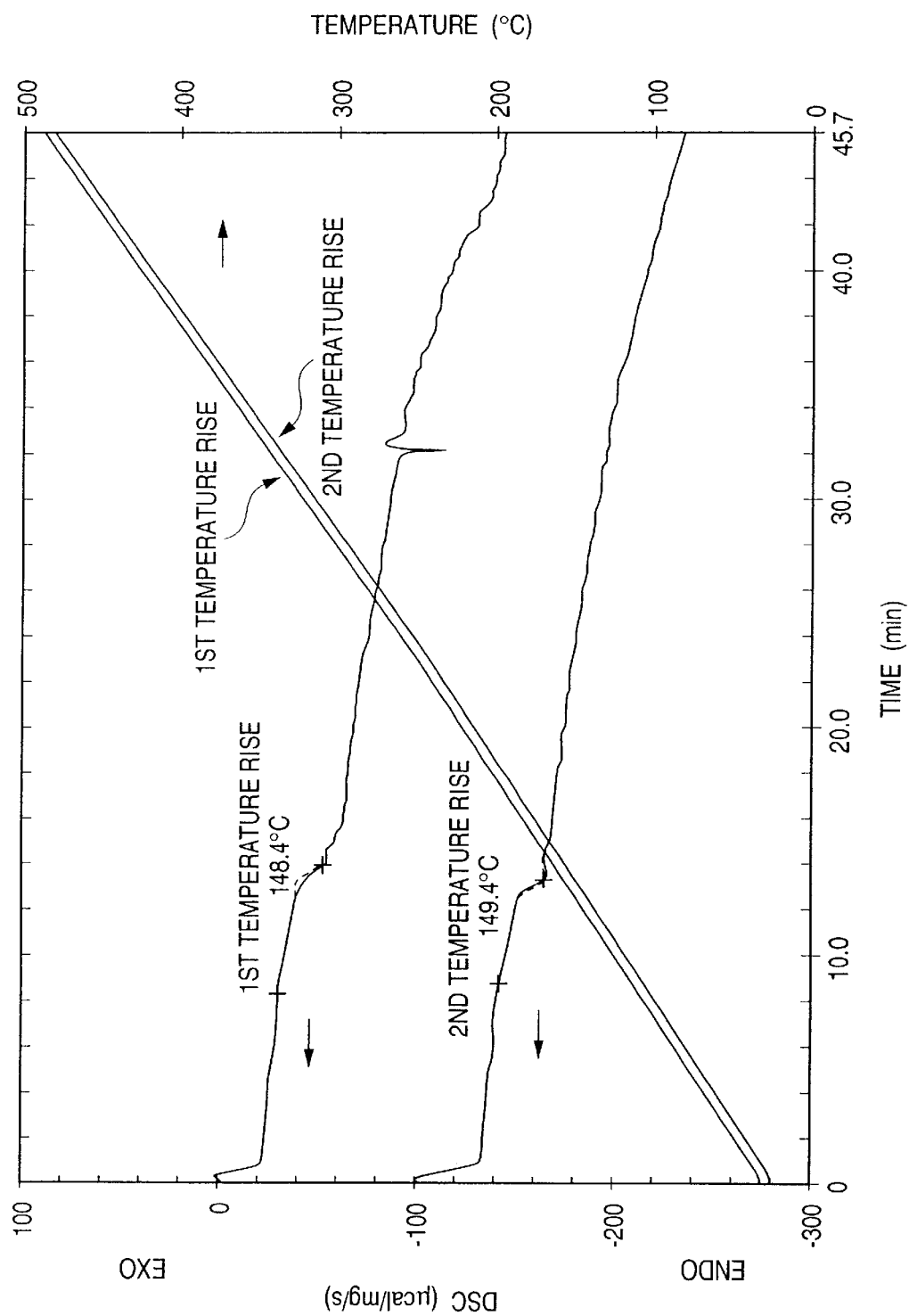
FIG. 3 is a graph illustrating DSC chart of NPTE-1.

NPTE-1 thus obtained was then measured for glass transition temperature Tg by means of a differential scanning calorimeter (DSC). As a result, the product showed Tg of 148.4° C. at the first heat rise and 149.4° C. at the second heat rise as shown in FIG. 3.

Synthesis Example 2

70.2 g of 4-(N-phenyl-N-(2-naphthyl))amino-4'-iodobiphenyl represented by the foregoing formula (1c) synthesized in the same manner as in Synthesis Example 1 and 12.0 g (56.53 mmol) of 3,3'-dimethylbenzidine represented by the following formula (1e):

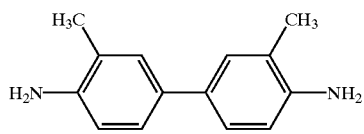

were allowed to undergo reaction in the presence of 27.3 g (197.84 mmol) of potassium carbonate and 1.1 g (16.96 mmol) of copper powder in decalin at a temperature of 140° C. for days. The reaction product was then column-purified with 1 kg of silica gel to obtain N,N'-bis(N-phenyl-N-(2-naphthyl)-4'-aminobiphenyl-4-il)-1,1'-biphenyl-3,3'-dimethyl-4,4'-diamine represented by the following formula (1f).

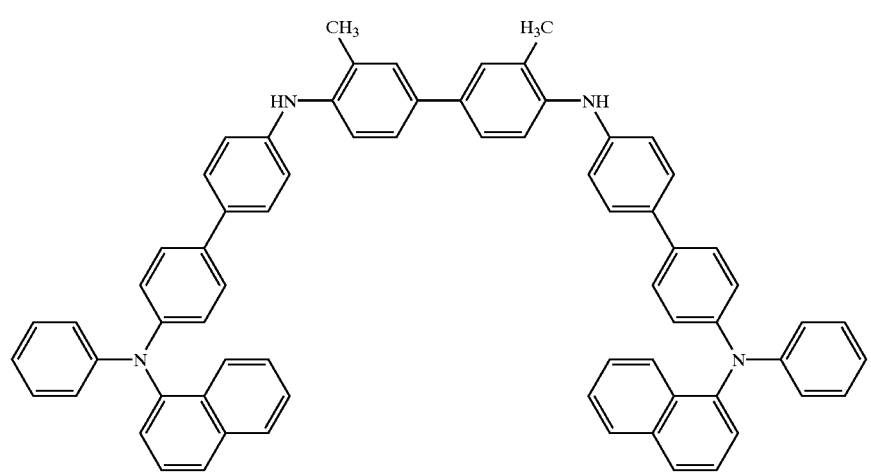

The yield was 72%.

21.4 g (22.50 mmol) of N,N'-bis(N-phenyl-N-(2-naphthyl)-4'-aminobiphenyl-4-il)-1,1'-biphenyl-3,3'-dimethyl-4,4'-diamine thus obtained and 10.1 g (49.49 mmol) of iodobenzene represented by the following formula (1g):

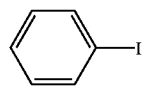

were then allowed to undergo reaction in the presence of 27.3 g (197.84 mmol) of potassium carbonate and 1.1 g (16.96 mmol) of copper powder in decalin at a temperature of 200° C. The reaction product was subjected to column purification, purification by recrystallization and purification by sublimation to obtain a crystal. The yield was 34%.

The crystal thus obtained was then subjected to liquid chromatography (HLPC) under the following conditions. As a result, it was confirmed that the peak corresponding to NPTE-3 represented by the foregoing formula (1-3) as desired compound has an area of not less than 99%.
(Conditions)
  Column material: Silica gel
  Mobile phase: Acetonitrile/tetrahydrofuran=9/1 (by weight)
  Detection: UV 350 nm Using a mass spectrophotograph (JEOL SX-102, produced by JEOL Ltd.), the crystal was analyzed at an accelerating voltage of 8 kV. As a result, a main peak was observed at 1,102, which corresponds to the molecular weight of NPTE-3.

Figure 4:
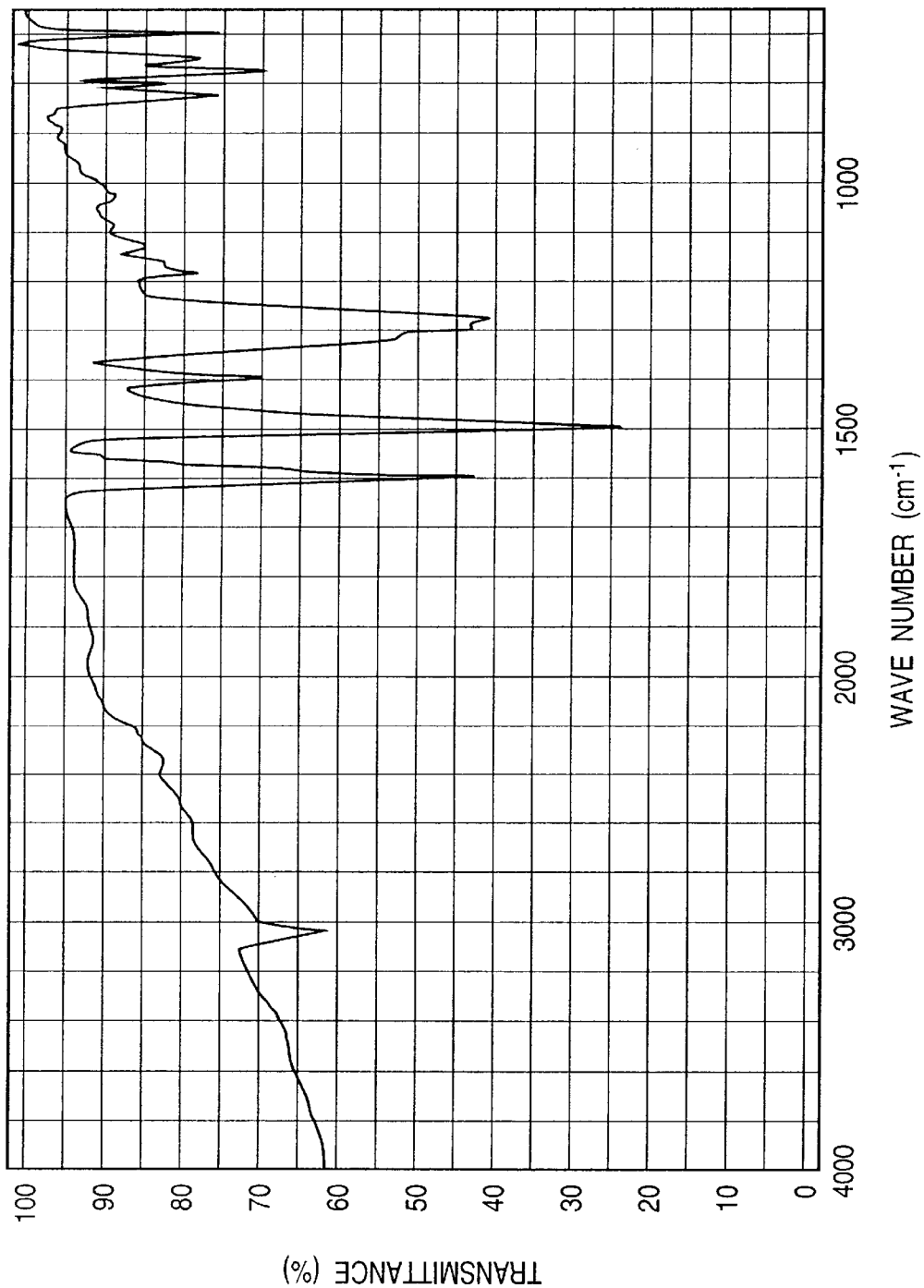
FIG. 4 is a graph illustrating IR chart of NPTE-3 of the present invention synthesized in Synthesis Example 2.

It was confirmed also from the chart of FIG. 4 illustrating the results of infrared absorption spectrum measurement (K-Br method) that the crystal is the desired compound, which is NPTE-3 represented by the foregoing formula (1-3).

NPTE-3 was then measured for glass transition temperature Tg by means of a differential scanning calorimeter (DSC). As a result, the product showed Tg of 143.8° C. at the first heat rise and 145.3° C. at the second heat rise.

Preparation of Organic Electroluminescence Device

Example 1

A glass substrate with a size of 25 mm long×25 mm wide×1 mm thick having an ITO electrically-conductive transparent layer formed by sputtering process on one side thereof as an anode was supersonically cleaned sequentially with a surface active agent and an organic solvent, and then subjected to ultraviolet ozone treatment so that it was cleaned.

Subsequently, the foregoing glass substrate was placed in a vacuum evaporation apparatus where the following various layers were then sequentially deposited on the surface thereof by vacuum evaporation method at a pressure of from $10^{-6}$ to $10^{-7}$ torr.

(1) A hole-transporting layer having a thickness of 60 nm formed by vacuum-evaporating NPTE-1 synthesized in Synthesis Example 1 as a hole-transporting material from a quartz crucible disposed in the vacuum evaporation apparatus by resistance heating method;

(2) An electron-transporting layer having a thickness of 60 nm formed by vacuum-evaporating Alq as an electron-transporting material from another quartz crucible disposed in the vacuum evaporation apparatus by resistance heating method;

(3) A cathode having a two-layer structure comprising a layer having a thickness of 1 nm formed by vacuum-evaporating lithium fluoride from an alumina crucible disposed in the vacuum evaporation apparatus and a layer having a thickness of 100 nm formed by vacuum-evaporating aluminum from a tungsten boat disposed in the vacuum evaporation apparatus by resistance heating method.

The substrate which had finished the vacuum evaporation step was transferred into a glove box filled with nitrogen gas where it was then sealed with an epoxy resin-based ultraviolet-curing sealing material in such an arrangement that the foregoing various layers didn't come in contact with air. Thus, an organic electroluminescence device having a light-emitting region with a size of 3 mm square as mentioned above and an organic layer consisting of two layers, i.e., hole-transporting layer and electron-transporting layer was prepared.

The device thus prepared comprised a substrate, an ITO electrically-conductive transparent layer, a hole-transporting layer (NPTE-1, 60 nm), an electron-transporting layer (Alq, 60 nm), and a cathode (lithium fluoride layer (1 nm)/aluminum layer (100 nm)).

A dc voltage was then applied to the device thus prepared across the two opposing electrodes at room temperature in the atmosphere to determine the voltage-luminance characteristics, emission spectrum and luminance-external quantum efficiency characteristics thereof.

Figure 5:
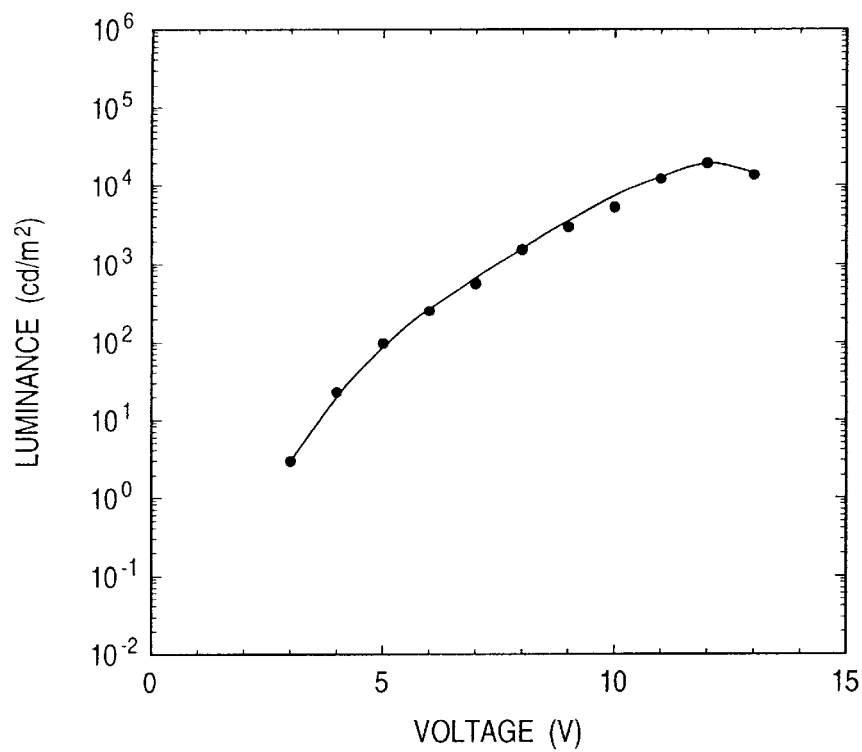
FIG. 5 is a graph illustrating the voltage-luminance characteristics of the organic electroluminescence device prepared in Example 1.

As shown in FIG. 5 illustrating the voltage-luminance characteristics of the device, the device of Example 1 emits light with a luminance as high as not less than 100 cd/m$^2$ at an applied voltage of 5 V, demonstrating that the device of Example 1 begins to emit light at a low voltage.

Figure 6:
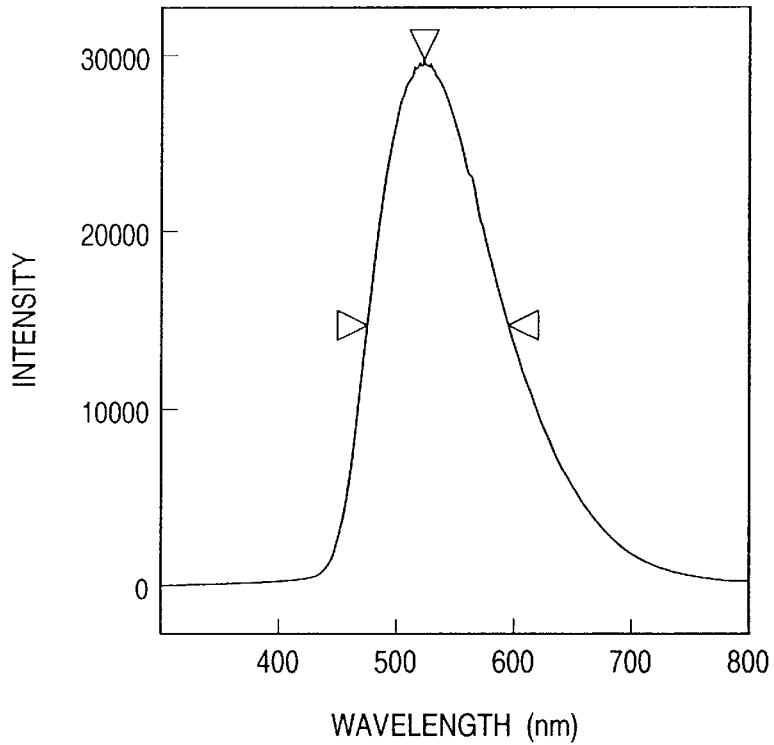
FIG. 6 is a graph illustrating the emission spectrum of the device of Example 1.

As shown in FIG. 6 illustrating emission spectrum, the device of Example 1 emits green light having a peak wavelength of 523 nm. Since the peak wavelength corresponds to that of fluorescent spectrum of Alq constituting the electron-transporting layer, it was made obvious that the electron-transporting layer emits light.

Figure 7:
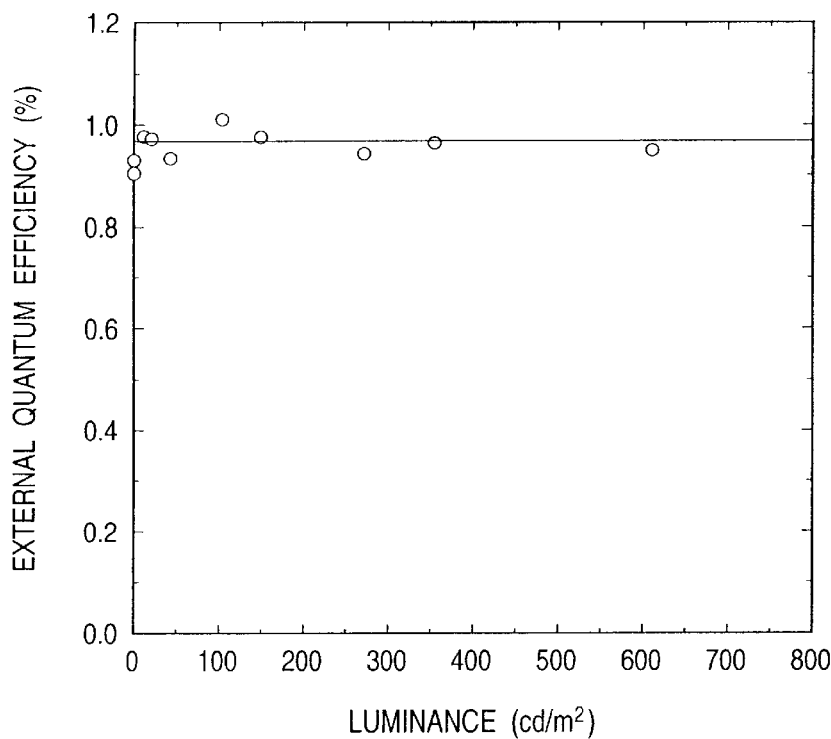
FIG. 7 is a graph illustrating the luminance-external quantum efficiency characteristics of the device of Example 1.
Figure 8:
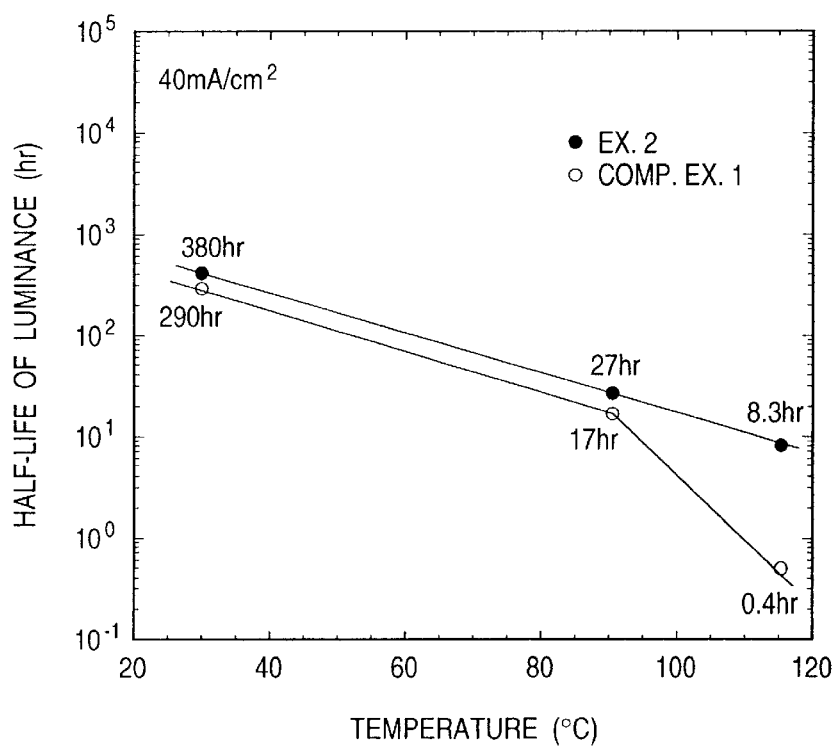
FIG. 8 is a graph illustrating the temperature-luminance half-life characteristics of the organic electroluminescence device prepared in Example 2 and Comparative Example 1.

As shown in FIG. 7 illustrating the luminance-external quantum efficiency characteristics, the device of Example 1 exhibits an external quantum efficiency of about 1.0% at a luminance of 100 cd/m$^2$. Since this external quantum efficiency value is as high as about 1.25 times that of a device comprising a hole-transporting layer having the same thickness but made of conventional TPTE instead of NPTE-1, which is 0.8%, it was made obvious that the device of Example 1 is excellent also in emission efficiency.

For the measurement of the external quantum efficiency $\phi_{EL}$ of the device, a method involving the determination of light including light scattered toward the device using an integrating sphere as described in the text of 6th lecture held by Organic Molecule/Bioelectronics Course of Society of Applied Physics (issued on Dec. 11, 1997), pp. 72–73 was employed.

Example 2

An organic electroluminescence device sealed with an epoxy resin-based ultraviolet-curing sealing material having a light emitting region with a size of 3 mm square and comprising an organic layer consisting of three layers, i.e., hole-injecting layer, hole-transporting layer and electron-transporting layer was prepared in the same manner as in Example 1 except that a hole-injecting layer having a thickness of 40 nm was provided interposed between the ITO electrically-conductive transparent layer as an anode and the hole-transporting layer comprising NPTE-1 by vacuum-evaporating the foregoing copper phthalocyanine from a quartz disposed in the vacuum evaporation apparatus and the hole-transporting layer comprising NPTE-1 had a thickness of 20 nm.

The device thus prepared comprised a substrate, an ITO electrically-conductive transparent layer, a hole-injecting layer (copper phthalocyanine, 40 nm), a hole-transporting layer (NPTE-1, 20 nm), an electron-transporting layer (Alq, 60 nm), and a cathode (lithium fluoride layer (1 nm)/aluminum layer (100 nm)).

Comparative Example 1

An organic electroluminescence device sealed with an epoxy resin-based ultraviolet-curing sealing material having a light emitting region with a size of 3 mm square and comprising an organic layer consisting of three layers, i-e., hole-injecting layer, hole-transporting layer and electron-transporting layer was prepared in the same manner as in Example 2 except that a hole-injecting layer having the same thickness as Example 2 was formed by conventional NPD instead of NPTE-1.

The device thus prepared comprised a substrate, an ITO electrically-conductive transparent layer, a hole-injecting layer (copper phthalocyanine, 40 nm), a hole-transporting layer (NPD, 20 nm), an electron-transporting layer (Alq, 60 nm), and a cathode (lithium fluoride layer (1 nm)/aluminum layer (100 nm)).

The devices of Example 2 and Comparative Example 1 were then measured for time required until the luminance is halved (half-life of luminance) while being driven at a constant current of 40 mA/cm$^2$ at a temperature of 30° C., 90° C. and 115° C. As a result, it was found that the device of Example 2 shows a remarkably prolonged life over all temperature ranges, particularly not lower than 80° C., as compared with the device of Comparative Example 1. Both the two examples showed an initial luminance of from about 1,020 to 1,280 cd/m$^2$ over all temperature ranges.

Comparative Example 2

An organic electroluminescence device sealed with an epoxy resin-based ultraviolet-curing sealing material having a light emitting region with a size of 3 mm square and comprising an organic layer consisting of three layers, i.e., hole-injecting layer, hole-transporting layer and electron-transporting layer was prepared in the same manner as in Example 2 except that a hole-transporting layer having the same thickness as Example 2 was formed by conventional TPTE instead of NPTE-1.

The device thus prepared comprised a substrate, an ITO electrically-conductive transparent layer, a hole-injecting layer (copper phthalocyanine, 40 nm), a hole-transporting layer (TPTE, 20 nm), an electron-transporting layer (Alq, 60 nm), and a cathode (lithium fluoride layer (1 nm)/aluminum layer (100 nm)).

Figure 9:
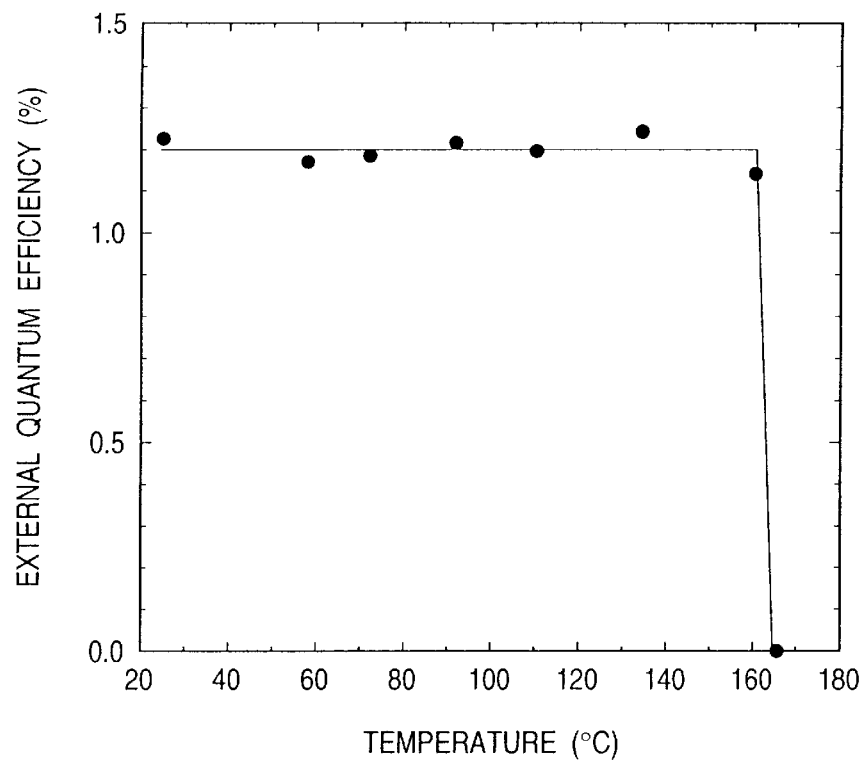
FIG. 9 is a graph illustrating the temperature-external quantum efficiency characteristics of the device of Example 2.
Figure 10:
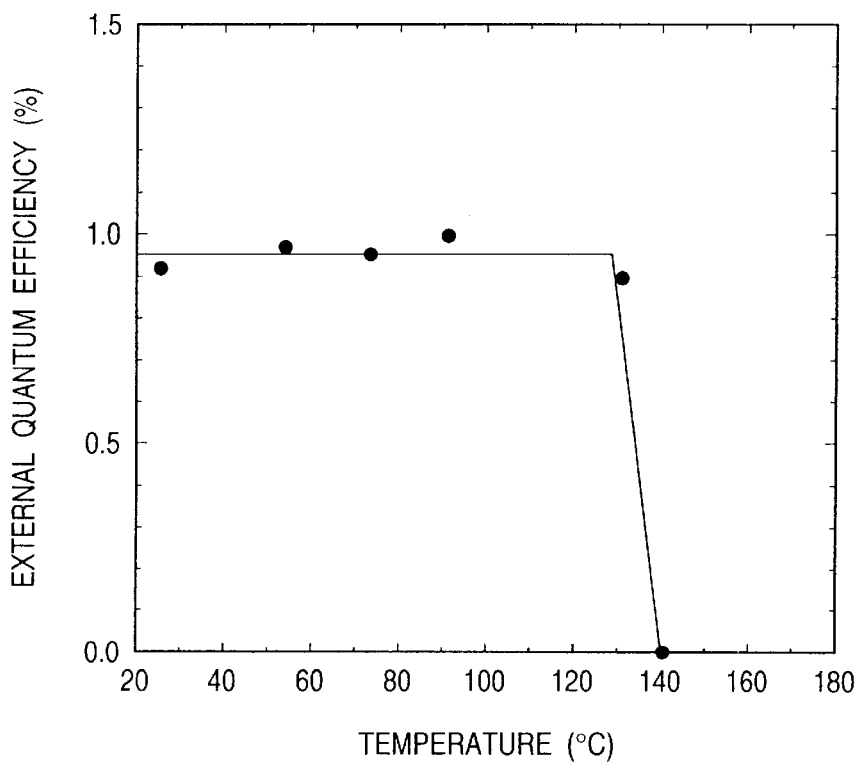
FIG. 10 is a graph illustrating the temperature-external quantum efficiency characteristics of the organic electroluminescence device prepared in Comparative Example 2.

The devices of Example 2 and Comparative Example 2 were then measured for temperature-external quantum efficiency characteristics at a luminance of 100 cd/m$^2$. As a result, it was found that the device of Example 2 provides stable light emission while maintaining an external quantum efficiency as high as about 1.2% up to 160° C. and then stops light emission at last at 165° C. as shown in FIG. 9. On the contrary, it was found that the device of Comparative Example 2 shows an external quantum efficiency as low as 0.95% and stops light emission at 140° C. as shown in FIG. 10. It was thus confirmed from these facts that the device of Example 2 exhibits a higher luminous efficiency and a better heat resistance than the device of Comparative Example 2.

Comparative Example 3

An organic electroluminescence device sealed with an epoxy resin-based ultraviolet-curing sealing material having a light emitting region with a size of 3 mm square and comprising an organic layer consisting of three layers, i.e., hole-injecting layer, hole-transporting layer and electron-transporting layer was prepared in the same manner as in Example 2 except that a hole-transporting layer having the same thickness as Example 2 was formed by conventional HTM1 instead of NPTE-1.

The device thus prepared comprised a substrate, an ITO electrically-conductive transparent layer, a hole-injecting layer (copper phthalocyanine, 40 nm), a hole-transporting layer (HTM1, 20 nm), an electron-transporting layer (Alq, 60 nm), and a cathode (lithium fluoride layer (1 nm)/aluminum layer (100 nm)).

The device of Comparative Example 3 was then measured for temperature at which light emission stops in the same manner as in Example 2 and comparative Example 2. As a result, it was found that the device of Comparative Example 3 exhibits a far lower heat resistance than Comparative Example 2.

Example 3

An organic electroluminescence device sealed with an epoxy resin-based ultraviolet-curing sealing material having a light emitting region with a size of 3 mm square and comprising an organic layer consisting of three layers, i.e., hole-injecting layer, hole-transporting layer and electron-transporting layer was prepared in the same manner as in Example 2 except that a hole-transporting layer having the same thickness as Example 2 was formed by NPTE-2 instead of NPTE-1.

The device thus prepared comprised a substrate, an ITO electrically-conductive transparent layer, a hole-injecting layer (copper phthalocyanine, 40 nm), a hole-transporting layer (NPTE-2, 20 nm), an electron-transporting layer (Alq, 60 nm), and a cathode (lithium fluoride layer (1 nm)/aluminum layer (100 nm)).

Figure 11:
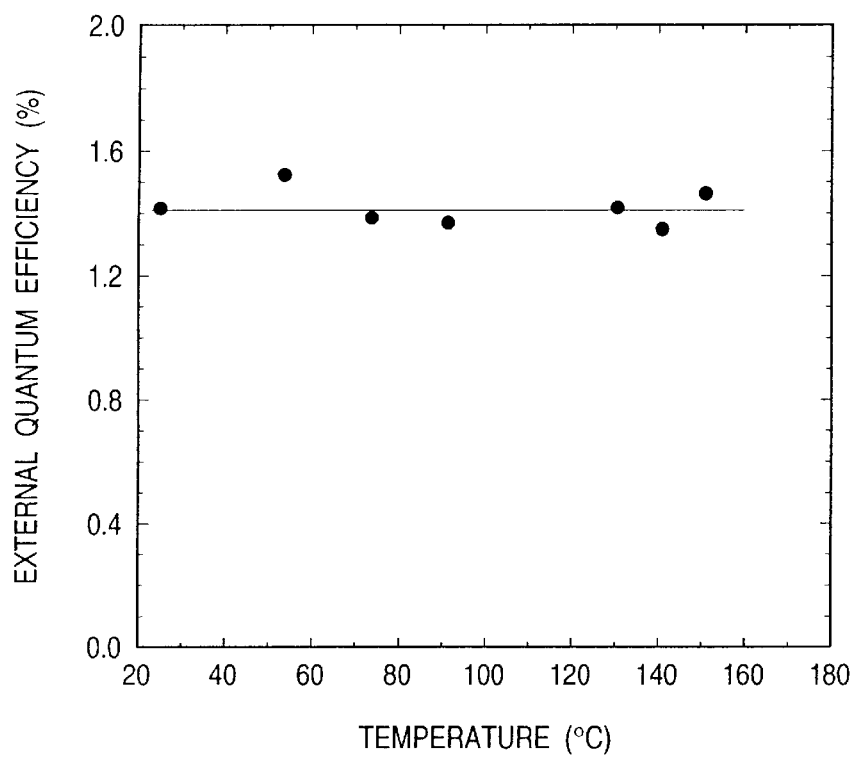
FIG. 11 is a graph illustrating the temperature-external quantum efficiency characteristics of the organic electroluminescence device prepared in Comparative Example 3.

The device of Example 3 was then measured for temperature-external quantum efficiency at a luminance of 100 cd/m$^2$ in the same manner as in Example 2 and Comparative Example 2. As a result, it was found that the device of Example 3 provides stable light emission while maintaining an external quantum efficiency as high as 1.4% up to 150° C. as shown in FIG. 11.

Example 4

An organic electroluminescence device sealed with an epoxy resin-based ultraviolet-curing sealing material having a light emitting region with a size of 3 mm square and comprising an organic layer consisting of three layers, i.e., hole-injecting layer, hole-transporting layer and electron-transporting layer was prepared in the same manner as in Example 2 except that a hole-transporting layer having the same thickness as Example 2 was formed by NPTE-3 synthesized in Synthesis Example 2 instead of NPTE-1.

The device thus prepared comprised a substrate, an ITO electrically-conductive transparent layer, a hole-injecting layer (copper phthalocyanine, 40 nm), a hole-transporting layer (NPTE-3, 20 nm), an electron-transporting layer (Alq, 60 nm), and a cathode (lithium fluoride layer (1 nm)/aluminum layer (100 nm)).

Figure 12:
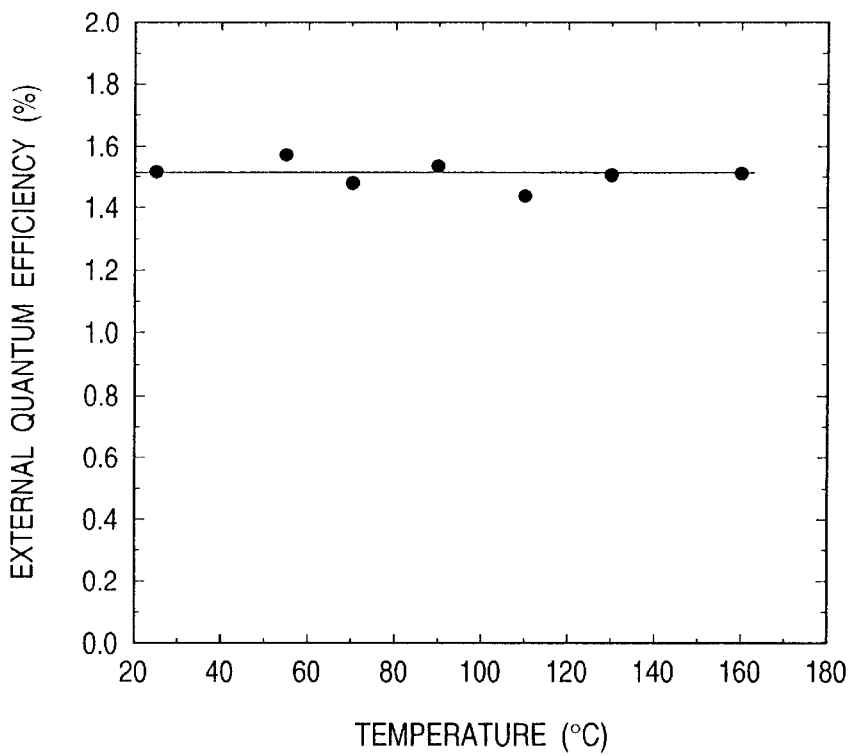
FIG. 12 is a graph illustrating the temperature-external quantum efficiency characteristics of the organic electroluminescence device prepared in Comparative Example 4.

The device of Example 4 was then measured for temperature-external quantum efficiency at a luminance of 100 cd/m$^2$ in the same manner as in Examples 2 and 3 and Comparative Example 2. As a result, it was found that the device of Example 4 provides stable light emission while maintaining an external quantum efficiency as high as 1.5% up to 160° C. as shown in FIG. 12.

Example 5

An organic electroluminescence device sealed with an epoxy resin-based ultraviolet-curing sealing material having a light emitting region with a size of 3 mm square and comprising an organic layer consisting of three layers, i.e., hole-injecting layer, hole-transporting layer and electron-transporting layer was prepared in the same manner as in Example 2 except that the hole-transporting layer comprising NPTE-1 comprised a fluorescent dye incorporated therein in an amount of from 0.1 to 10% by simultaneous vacuum evaporation method.

The device thus prepared comprised a substrate, an ITO electrically-conductive transparent layer, a hole-injecting layer (copper phthalocyanine, 40 nm), a hole-transporting layer (NPTE-1+fluorescent dye, 20 nm), an electron-transporting layer (Alq, 60 nm), and a cathode (lithium fluoride layer (1 nm)/aluminum layer (100 nm)).

The device thus prepared was able to perform the following light emission by properly changing the kind and content of fluorescent dyes:

(1) A device comprising rubrene incorporated in its hole-transporting layer in an amount of 1% emitted yellow light at a peak wavelength of 565 nm. The device showed a luminance of not less than 250 cd/m$^2$ when driven at 5 V, 3 mA/cm$^2$ and room temperature in the atmosphere.

(2) A device comprising coumarine in its hole-transporting layer in an amount of 0.8% emitted green light.

(3) A device comprising a quinacridone derivative represented by the foregoing formula (10-1) wherein $R^{12}$ and $R^{11}$ each are a methyl group in its hole-transporting layer in an amount of 0.8%, too, emitted green light.

Example 6

An organic electroluminescence device sealed with an epoxy resin-based ultraviolet-curing sealing material having a light emitting region with a size of 3 mm square and comprising an organic layer consisting of three layers, i.e., hole-injecting layer, hole-transporting layer and electron-transporting layer was prepared in the same manner as in Example 2 except that an electron-transporting layer having a thickness of 20 nm formed by vacuum-evaporating DPTAZ2 from another quartz crucible disposed in the vacuum evaporation apparatus by resistance heating method instead of the single-layer electron-transporting layer comprising Al and an electron-injecting layer having a thickness of 40 NM formed by vacuum-evaporating CNTAZ2 from a further quartz crucible by resistance heating method were sequentially provided interposed between the hole-transporting layer and the cathode.

The device thus prepared comprised a substrate, an ITO electrically-conductive transparent layer, a hole-injecting layer (copper phthalocyanine, 40 nm), a hole-transporting layer (NPTE-1, 20 nm), an electron-transporting layer (DPTAZ2, 20 nm), an electron-injecting layer (CNTAZ, 40 nm), and a cathode (lithium fluoride layer (1 nm)/aluminum layer (100 nm)).

The device thus prepared emitted blue light at a peak wavelength of 440 nm from its electron-transporting layer, which comprises DPTAZ2. The device showed a luminance of 125 cd/m$^2$ when driven at 5 V, 3 mA/cm$^1$ and room temperature in the atmosphere.

As mentioned in detail above, the present invention can provide a novel triphenylamine derivative which exhibits a far higher heat resistance than ever and cannot easily form an exciplex with an electron-transporting material and an organic electroluminescence device which comprises such a triphenylamine derivative and thus exhibits a high heat resistance and a high luminous efficiency at the same time.

While the invention has been described in detail with reference to specific examples thereof, it will be apparent to one skilled in the art that various changes and modifications can be made therein without departing from the spirit and scope thereof.

What is claimed is:

1. A triphenylamine derivative represented by the following general formula (1):

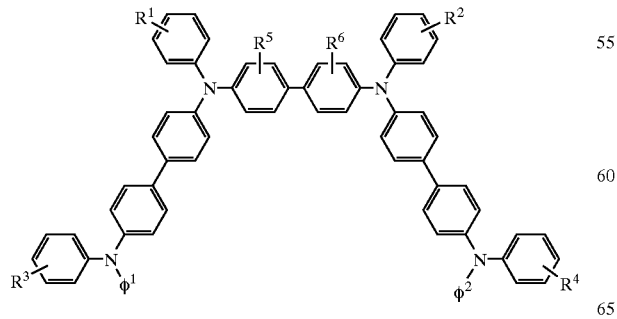

wherein $R^1$, $R^2$, $R^3$, R4, $R^5$ and $R^6$ may be the same or different and each represents a hydrogen atom, alkyl group, halogenated alkyl group, aryl group, dialkylamino group or cyano group; and $\phi^1$ and $\phi^2$ may be the same or different and each represents an aromatic condensed ring which may have a substituent.

2. A method of preparing a triphenylamine derivative represented by the following general formula (1d), said method comprising the steps of:

(a) reacting a molar ratio of a N-phenyl-N-(2-napthyl) amine having formula (1a)

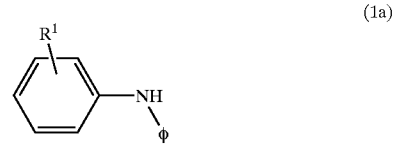

with 4,4-diiodobiphenyl to form a 4-(N-phenyl-N-(2-napthyl))amino-4'-iodobiphenyl having the following formula (1b)

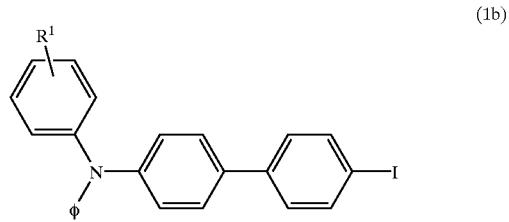

(b) reacting the compound of formula (1b) with N,N'-diphenylbenzidine represented by formula (1c) below in a molar ratio such that the compound of formula (1b) is more than 2 molar parts per one molar part of the compound of formula (1c)

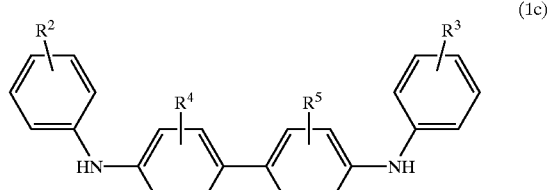

to form the diphenyl amine derivative having formula (1d)

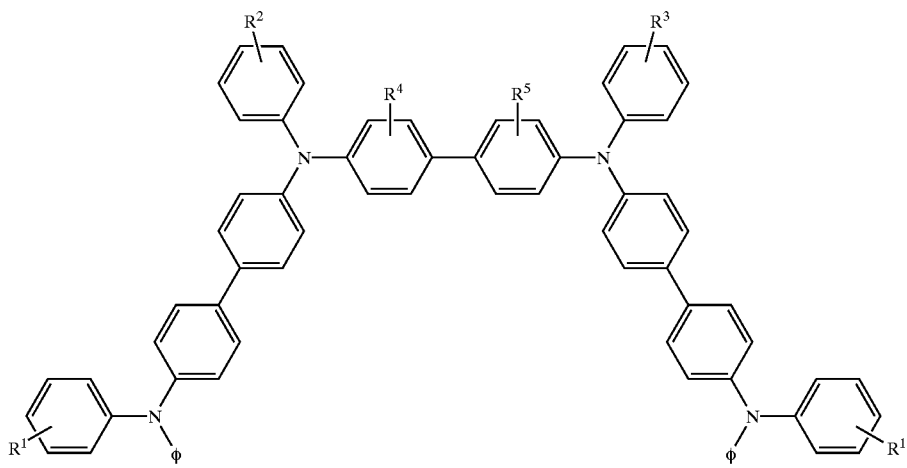

wherein $R^1$, $R^2$, $R^3$, $R^4$ and $R^5$ may be the same or different and each represents a hydrogen atom, alkyl group, halogenated alkyl group, aryl group, dialkylamino group or cyano group; and φ is a napthal group which may be a substituted napthyl group.

3. The method of claim 2, wherein formula (1a) is

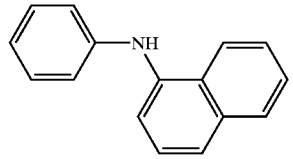

4. The method of claim 2, wherein formula (1b) is

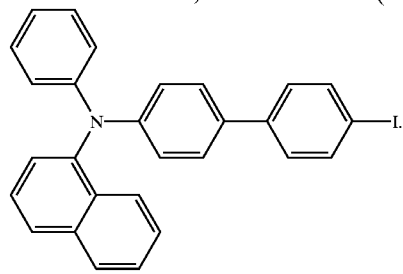

5. The method of claim 2, wherein formula (1c) is

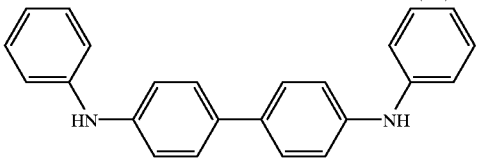

6. The method of claim 2, wherein formula (1d) is

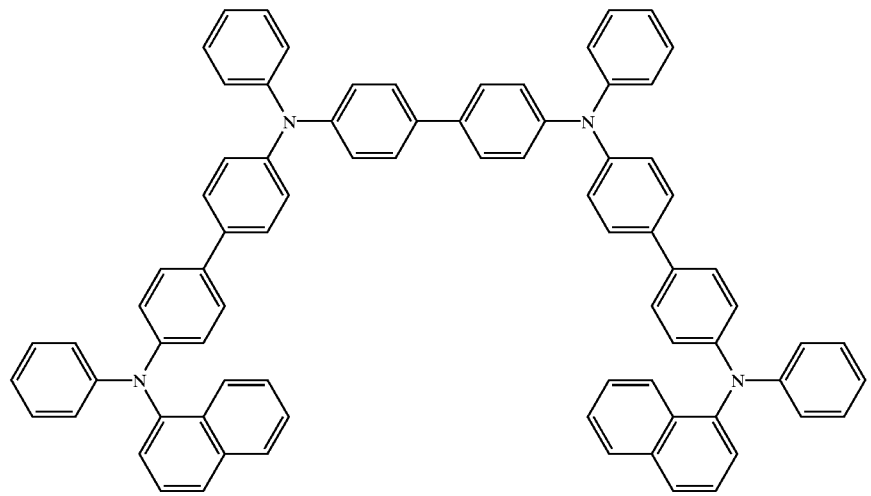

7. The method of claim 2, wherein formula (1d) is

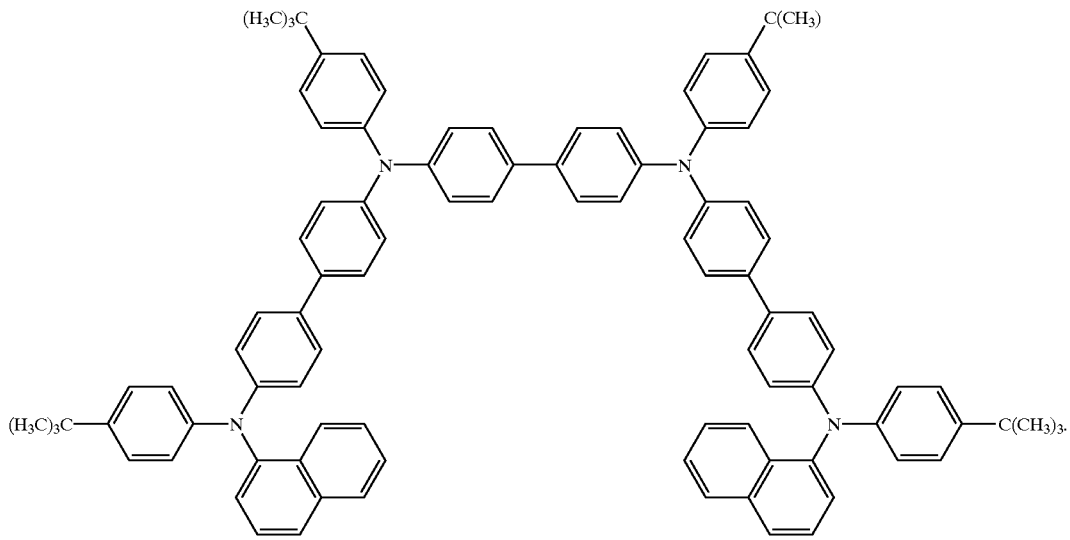

8. The method of claim 2, wherein formula (1d) is

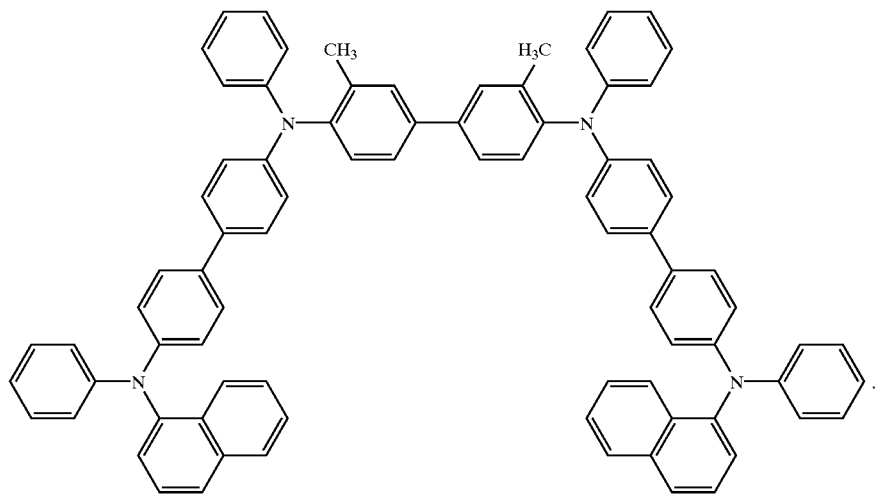

9. A method of forming an organic electroluminesent device comprisng the steps of:
(a) forming a first electrically conductive transparent layer on a substrate to form a first electrode,
(b) depositing at least one organic layer on said substrate, at least one organic layer containing a hole-transporting composition comprising a triphenylamine derivative prepared in accordance with claim 2,
(c) forming a second electrically conductive transparent layer on said organic layer to form a second electrode.

10. The method of claim 9, wherein said organic layer comprises a plurality of organic layers.

11. The method of claim 9, wherein the organic layer containing the triphenylamine derivative contains at least one fluorescent dye.

12. The method of claim 9, wherein said organic layer further includes an electron-transporting material comprising a 1,2,4-triazole derivative represented by the following general formula

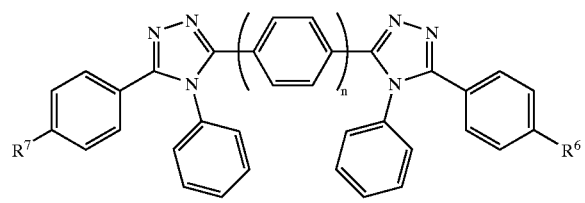

wherein $R^6$ and $R^7$ may be the same or different and each represents a cyano group or diarylamino group and n represents an integer of 1 or 2.

13. The method of claim 9, wherein the triphenylamine derivative is
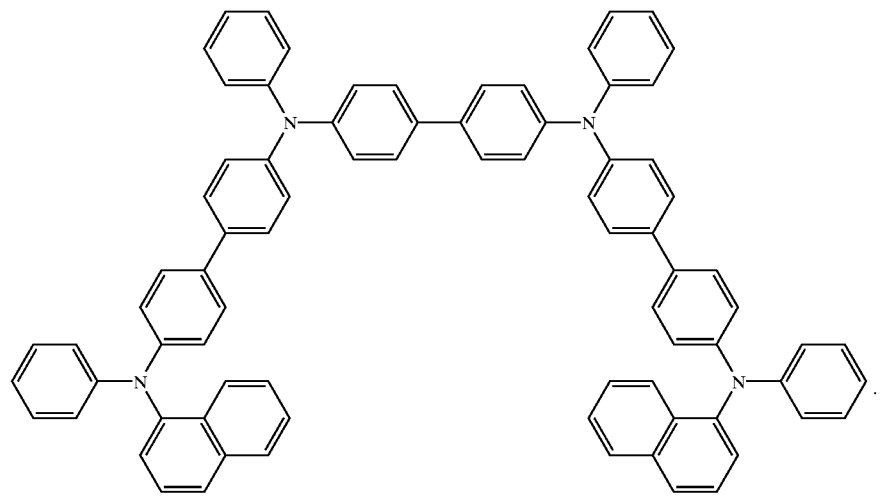
14. The method of claim 9, wherein the triphenylamine derivative is
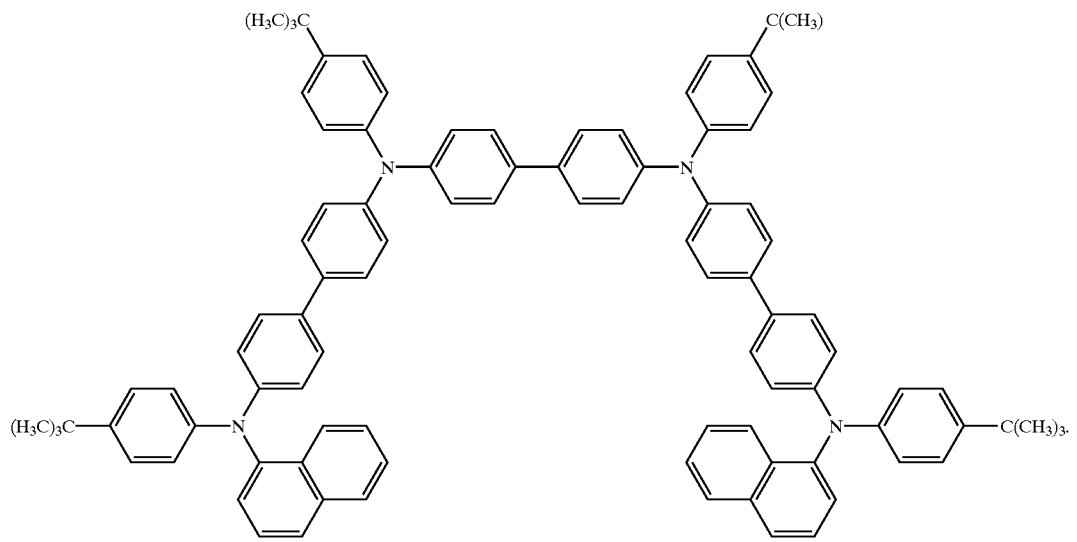

15. The method of claim 9, wherein the triphenylamine derivative is
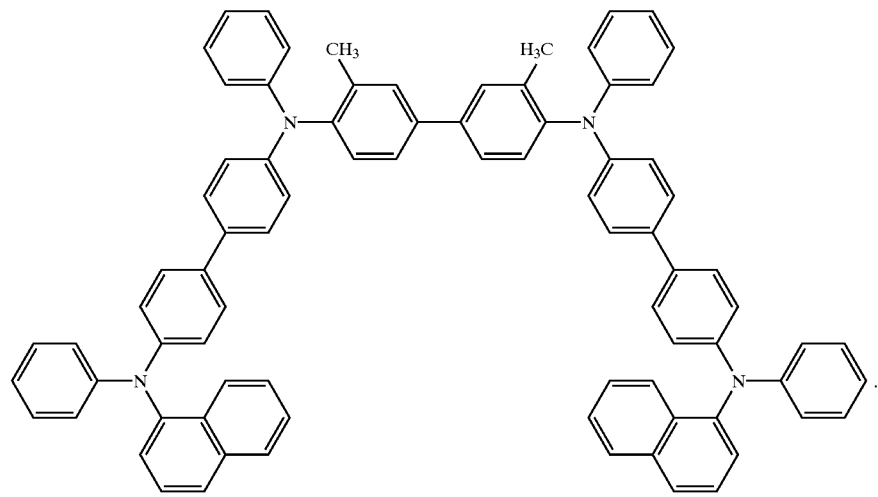
16. The method of claim 9, wherein the first electrode is an anode and the second electrode is a cathode.
17. The method of claim 9, wherein the first electrode is a cathode and the second electrode is an anode.
* * * * *